(12) United States Patent
Ogura et al.

(10) Patent No.: US 7,572,478 B2
(45) Date of Patent: Aug. 11, 2009

(54) LIGHT EMITTING DEVICE

(75) Inventors: Keiiti Ogura, Saitama (JP); Masahiro Takahashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 619 days.

(21) Appl. No.: 11/192,104

(22) Filed: Jul. 29, 2005

(65) Prior Publication Data

US 2005/0260337 A1  Nov. 24, 2005

Related U.S. Application Data

(63) Continuation of application No. 09/966,740, filed on Oct. 1, 2001, now Pat. No. 6,924,594.

(30) Foreign Application Priority Data

Oct. 3, 2000  (JP)  ............................ 2000-304246

(51) Int. Cl.
*B05D 5/06* (2006.01)
*H01J 9/26* (2006.01)

(52) U.S. Cl. .................... 427/66; 427/69; 313/504; 313/512; 313/553; 445/25; 445/31; 428/917

(58) Field of Classification Search ................ 313/504, 313/512, 553; 445/25, 31; 427/66, 69; 428/917
See application file for complete search history.

(56) References Cited

U.S. PATENT DOCUMENTS

| | | | |
|---|---|---|---|
| 4,599,538 A | 7/1986 | Hidler et al. | |
| 5,107,175 A | 4/1992 | Hirano et al. | |
| 5,124,204 A | 6/1992 | Yamashita et al. | |
| 5,189,405 A * | 2/1993 | Yamashita et al. | 313/512 |
| 5,518,824 A * | 5/1996 | Funhoff et al. | 428/690 |
| 5,684,365 A | 11/1997 | Tang et al. | |
| 5,686,360 A | 11/1997 | Harvey, III et al. | |
| 5,693,956 A | 12/1997 | Shi et al. | |
| 5,757,126 A | 5/1998 | Harvey, III et al. | |
| 5,771,562 A | 6/1998 | Harvey, III et al. | |
| 5,811,177 A | 9/1998 | Shi et al. | |

(Continued)

FOREIGN PATENT DOCUMENTS

EP  0 999 595 A2  5/2000

(Continued)

OTHER PUBLICATIONS

Shunpei Yamazaki et al.; "Light Emitting Device and Method of Manufacturing the Same", U.S. Appl. No. 09/707,862, filed Nov. 7, 2000, pp. 1-49 including drawings (9 sheets).

*Primary Examiner*—Timothy H Meeks
*Assistant Examiner*—Jimmy Lin
(74) *Attorney, Agent, or Firm*—Fish & Richardson P.C.

(57) ABSTRACT

A technique for sealing an EL panel of a light emitting device is provided. By preparing a absorption metal as a film on EL elements on the inside of an enclosed space, it becomes easy to made the interior of the space possess a absorption function, and further, an enclosure structure can be fabricated without the penetration of oxygen and moisture into the space because the absorption film is formed in succession after formation of the EL elements, according to the present invention.

13 Claims, 16 Drawing Sheets

U.S. PATENT DOCUMENTS

| | | | |
|---|---|---|---|
| 5,817,366 | A | 10/1998 | Arai et al. |
| 5,909,081 | A | 6/1999 | Eida et al. |
| 5,952,778 | A | 9/1999 | Haskal et al. |
| 5,962,962 | A | 10/1999 | Fujita et al. |
| 5,990,615 | A | 11/1999 | Sakaguchi et al. |
| 5,990,629 | A | 11/1999 | Yamada et al. |
| 6,046,543 | A | 4/2000 | Bulovic et al. |
| 6,049,167 | A | 4/2000 | Onitsuka et al. |
| 6,118,212 | A * | 9/2000 | Nakaya et al. ............. 313/503 |
| 6,121,726 | A | 9/2000 | Codama et al. |
| 6,132,280 | A * | 10/2000 | Tanabe et al. ................ 445/58 |
| 6,146,225 | A | 11/2000 | Sheats et al. |
| 6,150,187 | A | 11/2000 | Zyung et al. |
| 6,160,346 | A | 12/2000 | Vleggaar et al. |
| 6,172,459 | B1 | 1/2001 | Hung et al. |
| 6,195,142 | B1 | 2/2001 | Gyotoku et al. |
| 6,198,217 | B1 | 3/2001 | Suzuki et al. |
| 6,198,220 | B1 | 3/2001 | Jones et al. |
| 6,239,470 | B1 | 5/2001 | Yamazaki |
| 6,274,887 | B1 | 8/2001 | Yamazaki et al. |
| 6,413,645 | B1 | 7/2002 | Graff et al. |
| 6,441,468 | B1 | 8/2002 | Yamazaki |
| 6,525,339 | B2 | 2/2003 | Motomatsu |
| 6,605,826 | B2 | 8/2003 | Yamazaki et al. |
| 6,710,542 | B2 | 3/2004 | Chun et al. |
| 6,720,203 | B2 | 4/2004 | Carcia et al. |
| 6,737,753 | B2 | 5/2004 | Kumar et al. |
| 6,776,880 | B1 | 8/2004 | Yamazaki |
| 6,777,621 | B2 | 8/2004 | Ishikawa et al. |
| 6,803,127 | B2 | 10/2004 | Su et al. |
| 6,806,638 | B2 | 10/2004 | Lih et al. |
| 6,819,044 | B2 | 11/2004 | Shirakawa et al. |
| 6,831,298 | B2 | 12/2004 | Park et al. |
| 6,833,668 | B1 | 12/2004 | Yamada et al. |
| 6,835,950 | B2 | 12/2004 | Brown et al. |
| 6,940,223 | B2 | 9/2005 | Yamazaki |
| 2002/0125817 | A1 | 9/2002 | Yamazaki et al. |

FOREIGN PATENT DOCUMENTS

| | | |
|---|---|---|
| EP | 1 058 314 A2 | 12/2000 |
| EP | 1 058 484 A1 | 12/2000 |

* cited by examiner

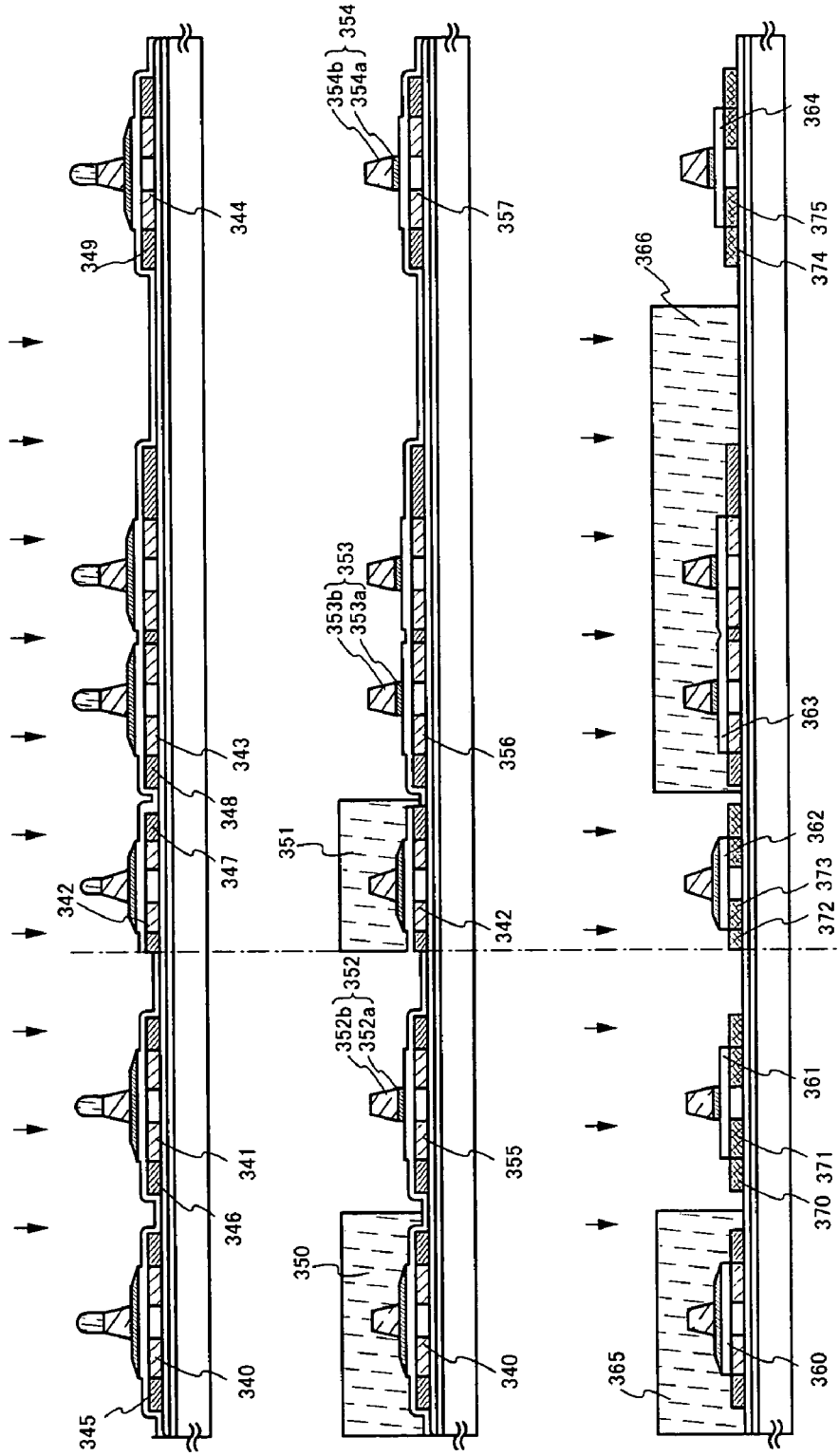

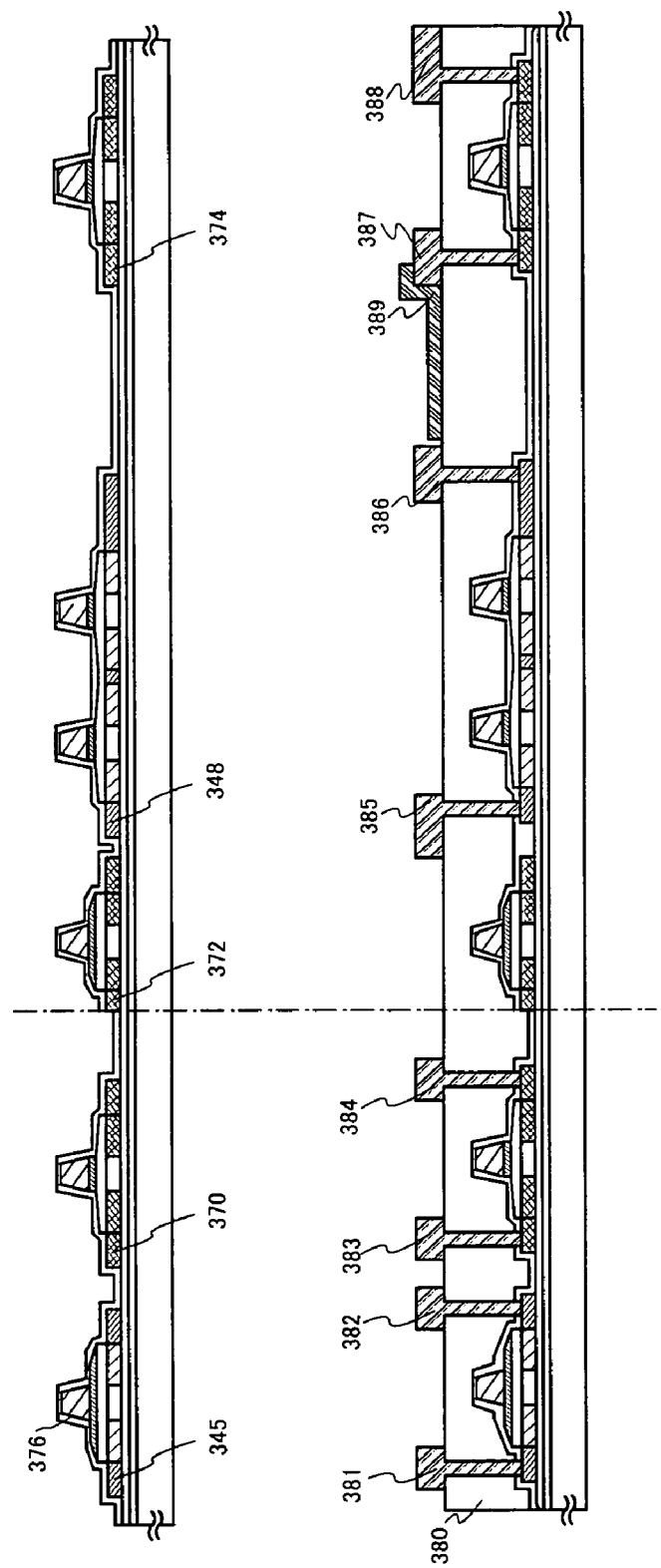

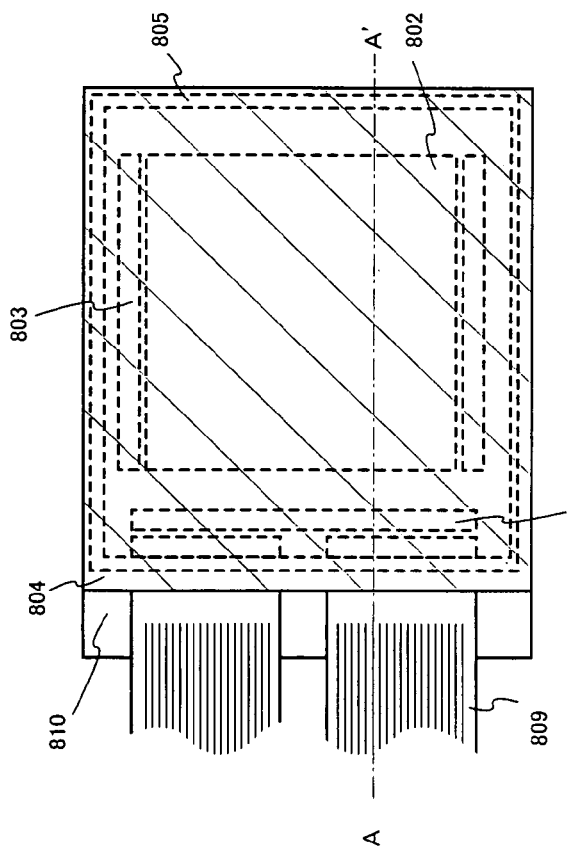
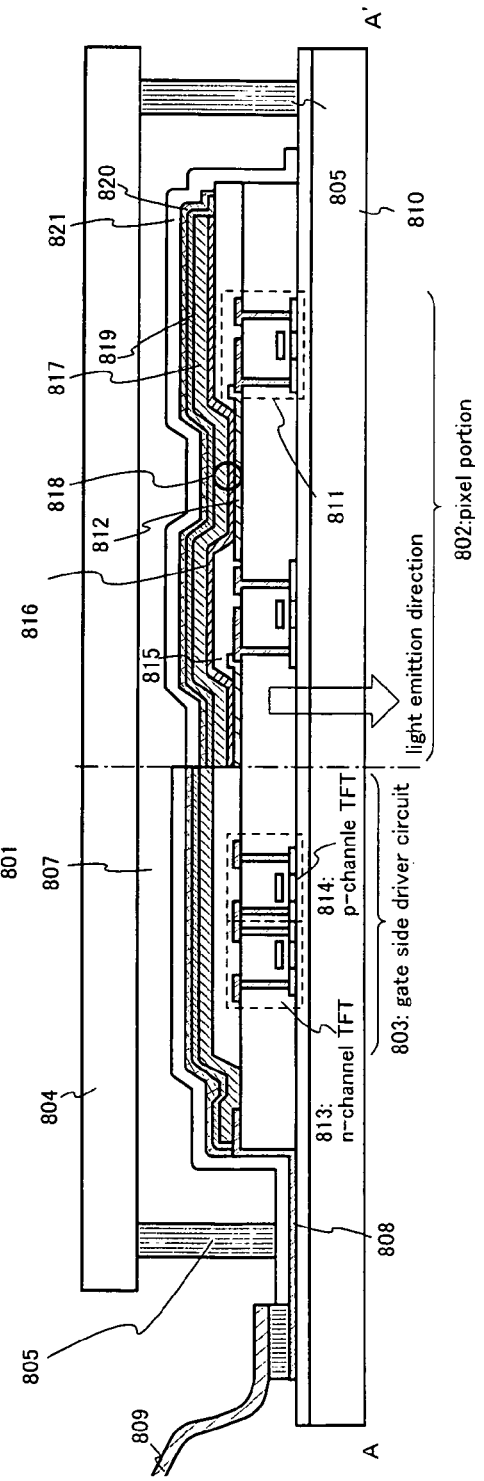
Fig. 8A
Fig. 8B

PRIOR ART light emitting direction

LIGHT EMITTING DEVICE

CROSS-REFERENCE TO RELATED APPLICATIONS

This application is a continuation application of U.S. application Ser. No. 09/966,740, filed Oct. 1, 2001 now U.S. Pat. No. 6,924,594, now allowed which claims the benefit of a foreign priority application filed in Japan as Ser. No. 2000-304246 on Oct. 3, 2000. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a device (hereinafter referred to as a light emitting device) formed by building an EL (electroluminescence) element on a substrate. In particular, the present invention relates to a sealing technique for an EL panel of a light emitting device in which EL elements formed on a substrate are sealed. Note that a module in which an FPC is connected to an EL panel, and an IC (integrated circuit) is directly mounted through the FPC, is referred to as a light emitting device within this specification.

2. Description of the Related Art

Research into light emitting devices having EL elements as light emitting elements has been active in recent years, and in particular, light emitting devices using organic materials as EL materials have received a lot of attention. These types of light emitting devices are referred to as organic EL displays (OELDs) or organic light emitting diodes (OLEDs).

Light emitting devices do not have viewing angle problems because they are self light emitting unlike liquid crystal display devices. Namely, light emitting devices are more suitable for use out of doors than liquid crystal displays, and a variety of usages have been proposed therefor.

EL elements are structured by an EL layer sandwiched between a pair of electrodes, and the EL layer normally has a lamination structure. A typical lamination structure proposed by Tang, et al., of Eastman Kodak Co., has a lamination structure made from a hole transporting layer, a light emitting layer, and an electron transporting layer. This structure has extremely high light emitting efficiency, and nearly all light emitting devices currently undergoing research and development employ this structure.

Further, additional structures may also be used in which a hole injecting layer, a hole transporting layer, a light emitting layer, and an electron transporting layer are laminated on an anode in the stated order; or in which a hole injecting layer, a hole transporting layer, a light emitting layer, an electron transporting layer, and an electron injecting layer are laminated on an anode in the stated order, may also be used. An element such as a fluorescing pigment may also be doped into the light emitting layer. Further, the layers may all be formed by films composed of low molecular weight materials, or they may all be formed by films composed of high molecular weight materials.

All layers formed between the anode and the cathode are defined generically as EL layers within this specification. Therefore, layers described above, namely the hole injecting layers, electron injecting layers, hole transporting layers, light emitting layers and electron transporting layers are all included in EL layers.

Note that a light emitting element formed by a cathode, an EL layer, and an anode is referred to as an EL element within this specification, and that there are two types of formation methods: a method of forming EL layers between two types of stripe shape electrodes formed to be mutually orthogonal (simple matrix method), and a method of forming EL layers between pixel electrodes and opposing electrodes arranged in a matrix shape and connected to TFTs (active matrix method).

Among EL elements, those using fluorescent organic compounds in their EL layers are referred to as organic EL elements, and the biggest problem in putting them to practical use is that the lifetime of the elements is insufficient. Further, element deterioration appears as a widening of non-light emitting regions (dark spots) accompanying long light emission time, and the major cause of this deterioration is due to cathode peeling.

The development of dark spots due to causes such as cathode oxidation and peeling often results from oxygen and moisture within the atmosphere. For example, it is possible to operate elements within the atmosphere if an electrode manufactured by a stable metal such as an MgAg composite is used, but the life of the elements is shortened. It is therefore ideal to perform manufacture of elements all at once in a vacuum or within a glove box under an inert gas atmosphere in order to obtain good element properties.

Namely, the sealing technique used becomes crucial in the manufacture of elements possessing sufficient lifetime for practical usage. A method in which elements are covered by a glass substrate under a dry nitrogen or inert gas atmosphere to seal the periphery by a resin is generally employed.

However, the development of dark spots has been observed even on sealing substrates. It is thought that this is due to promotion of a chemical reaction occurring between the electrodes and residual impurities due to a high electric field produced when driving the elements. In other words, matter adsorbed on the surface and matter emitted from the resin used in sealing exists even if the purity of the gas to be introduced is high, and therefore it is difficult to completely eliminate substances such as oxygen and moisture. The method shown below has been devised in view of this problem.

A cross sectional structure of a general EL panel seal is shown in FIG. 16. Reference numeral 1601 denotes a substrate in FIG. 16, reference numeral 1602 denotes an anode, reference numeral 1603 denotes an EL layer, and reference numeral 1604 denotes a cathode. The anode 1602 and the cathode 1604 are each electrically connected to an external power source. An EL element on the substrate 1601 composed of the anode 1602, the EL layer 1603, and the cathode 1604 is then sealed by a sealing substrate 1607, through a sealant 1608.

An absorption agent (also referred to as a water capturing agent) 1606 made from an absorption substance is added here in order to prevent deterioration of the EL element due to oxygen and moisture existing in a space 1609. This is discussed in detail in the following reference. (Reference: Shin Kawami, Takemi Naito, Hiroshi Ohata, Jin Nakata, "Effect of Water Capturing Agents in Enclosing of Organic EL Elements", The 45th Japan Society of Applied Physics Proceedings, p. 1223 (1998).

Note that as the absorption agent, there may be used physical absorption substances, typically silica gel, synthetic zeolites, and the like, and chemical absorption substances, typically phosphorous pentoxide, calcium chloride, and the like. However, chemical absorption substances take in absorbed moisture as water of crystallization, and there is no re-emission of moisture, and therefore chemical absorption substances such as barium oxide (BaO) are often used.

Further, as for a method of disposing the absorption agent, the generally adopted methods include: a method in which a space (depressions) for disposing thereon the absorption agent is formed in a sealing substrate, and after placing the absorption agent in the space, a film such as Teflon possessing adhesiveness is bonded thereto in order to prevent dispersion of the absorption agent; and a method in which a bag composed of a permeable substance and filled with the absorption agent is bonded to a sealing substrate so that the absorption agent does not disperse into the space 1609. However, there is also a method in which the absorption agent is directly dispersed within the space 1609.

An absorption agent 1606 such as barium oxide is prepared in the space 1609, as shown in FIG. 16.

Note that the absorption agent such as barium oxide is normally a solid in a powdered state, and therefore there are adopted a method of dispersing the absorption agent within the space as it is, or a method of wrapping this in a film made from a high molecular weight material to be bonded to a sealing substrate.

Further, since absorption agents are generally introduced by hand, the operation under an inert gas atmosphere may become more difficult. Further, in a case where it is intended to provide a wrapped absorption agent, the wrapping itself requires much work.

There are also cases in which introduction of the absorption agent is performed within the atmosphere due to the complexities of working under an inert gas atmosphere. However, in this case, obviously the problem with oxygen and moisture being contained within the space 1609 cannot be avoided.

SUMMARY OF THE INVENTION

In consideration of the above, an object of the present invention is to prevent EL element deterioration by providing a structure into which moisture and oxygen are not introduced, and by providing a simple and effective method for adding the absorption agent for absorbing moisture and oxygen, in the sealing of EL elements.

To solve the above problems, according to the present invention, improvements are made with respect to a material having an absorption property which is added, when performing enclosing of El element formed on a substrate, to the inside of the enclosed structure, and a method of adding the absorption material. Absorption films can thus be easily formed on EL elements, and in addition, EL element deterioration due to oxygen and moisture is prevented.

In the present invention, first an EL element composed of an anode, an EL layer, and a cathode is formed on a substrate, and then an absorption film is formed on the EL element. Note that the absorption film used in the present invention is a film formed from a material that is a metal having a low work coefficient and which easily oxides in oxygen, and in addition, the oxide thereof reacts with moisture to form a hydrate, thereby preventing-moisture from being re-emitted. Note also that alkaline earth metals such as beryllium, magnesium, calcium, strontium, barium, and radium can be used as the metallic material. Further, films made from this type of material is referred to as the absorption film within this specification.

Evaporation and sputtering can be given as methods for forming these types of absorption films, and it is preferable to use a method in which film formation can be performed successively after formation of the EL elements. Further, a resistive evaporation method (RE method) and an electron beam method (EB method) can be used if evaporation is employed.

Additionally, the absorption films may be formed directly on top of the EL elements, and may also be formed after forming a barrier film made from an insulating film such as silicon nitride or silicon oxide on the EL elements in order to prevent direct contact between moisture absorbed by the absorption film, and EL element electrodes.

Further, the absorption film is formed so as to cover the EL elements, and it is necessary to perform film formation selectively using means such as a metal mask so that the EL element are surrounded and so that there is no overlap with a sealant applied subsequently.

After forming the absorption film, sealing substrates are prepared in positions so as to sandwich the EL elements between the sealing substrates and the substrate, and a sealant is prepared between the substrate and the sealing substrates, forming an enclosure structure. Namely, oxygen and moisture existing in the inside of the enclosure structure here is captured by the absorption film formed in advance.

Furthermore, it is preferable to use a thermosetting resin or an ultraviolet setting resin as the sealant formed here. Note that the sealant is formed so as to surround the absorption agent formed on the EL elements.

The present invention may have a structure in which it is difficult for oxygen and moisture to penetrate to the inside of the enclosure structure by additionally forming a metallic film or the like so as to cover the sealing substrate and the sealant after forming the above enclosure structure.

However, it is necessary in this case to form an insulating film made from silicon nitride or silicon oxide in advance on a wiring for electrically connecting to EL element (electrodes connection wiring) formed on the outside of the enclosure structure. Further, a connection portion formed in order to connect the EL elements to external driver circuits must be cutoff by means such as a metal mask, such that a metallic film is not formed.

BRIEF DESCRIPTION OF THE DRAWINGS

In the accompanying drawings:

FIGS. 5A to 5C are diagrams showing the process of manufacturing a pixel TFT and driver circuit TFTs;

FIGS. 6A and 6B are diagrams showing the process of manufacturing a pixel TFT and driver circuit TFTs;

FIGS. 8A and 8B are diagrams showing an upper surface diagram and an enclosure structure, respectively, of a light emitting device;

DETAILED DESCRIPTION OF THE PREFERRED EMBODIMENT

Embodiment Mode

A method of sealing EL elements formed on a substrate is explained in an embodiment mode of the present invention.

Figure 1A:
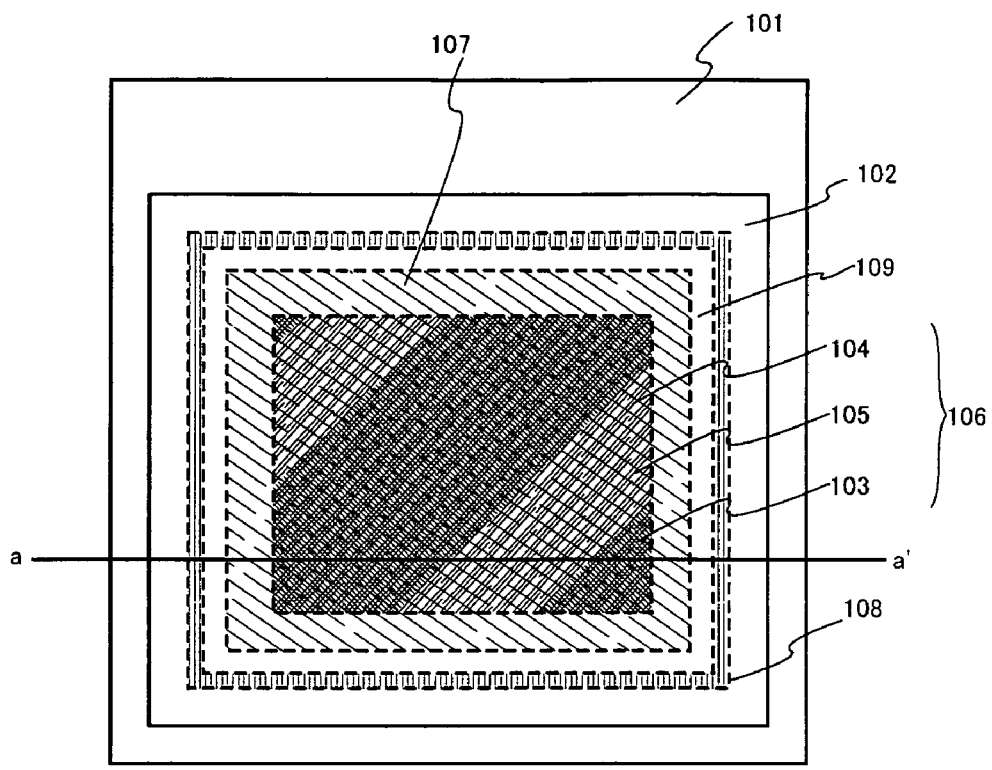
FIGS. 1A and 1B are diagrams for explaining the present invention.
Figure 1B:
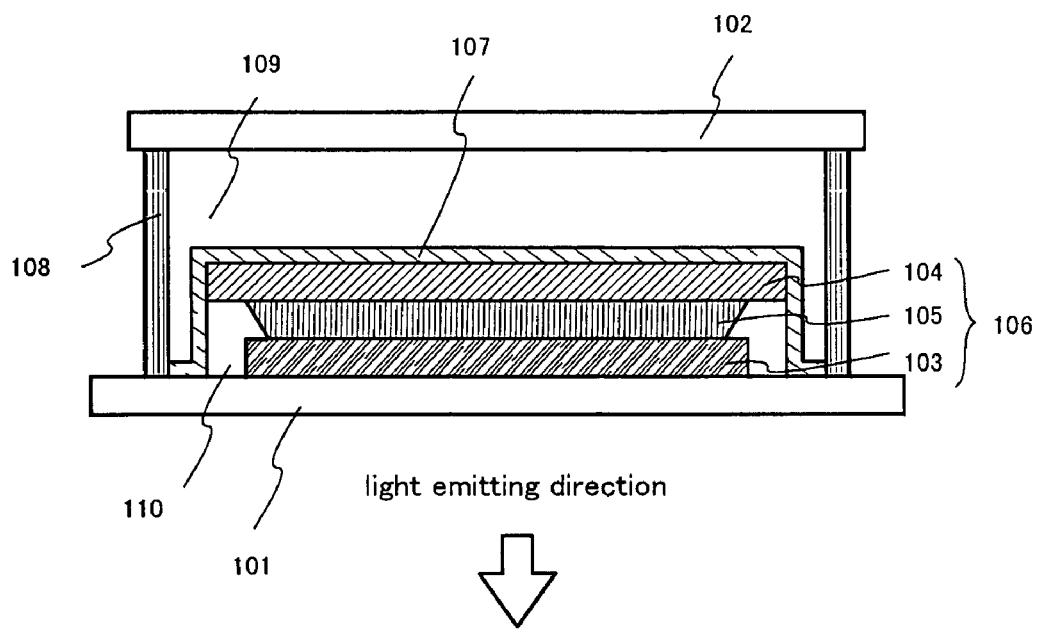

An upper surface diagram of an EL panel used in the present invention is shown in FIG. 1A, and a cross sectional structure of the EL panel is shown in FIG. 1B.

Reference numeral 101 denotes a substrate, and reference numeral 102 denotes a sealing substrate in FIGS. 1A and 1B, and an EL element 106 is sandwiched between the substrate 101 and the sealing substrate 102. Note that the EL element 106 has a structure in which an EL layer 105 is formed between an anode 103 and a cathode 104.

Note also that the anode 103 forming the EL element may be formed by sputtering, and the following can be used as the anode material: ITO, an alloy of tin oxide and indium oxide; a chemical compound of 2 to 20% of zinc oxide (ZnO) mixed into indium oxide); and a chemical compound made from zinc oxide and gallium oxide. Further, the cathode 104 can be formed using a metal having a low work coefficient, such as Mg:Ag or Yb. Edge portions of the anode 103 are covered by an insulating film 110 made from an insulating material.

The EL layer 105 can use a film formation technique such as evaporation, application, or printing. In addition, as a structure of the EL layers, a hole injecting layer, a hole transporting layer, light emitting layers, electron transporting layers, electron injecting layers, hole blocking layers, and buffer layers can be freely combined and used in a lamination structure, or as a single layer structure.

Further, known organic EL materials can be used in the EL layer 105, and either of high molecular weight (polymer) materials or low molecular weight (monomer) materials may be used. Additionally, a film made from a low molecular weight material and a film made from a high molecular weight material may be laminated to form the EL layer 105.

Note that the present invention can be applied to not only active matrix EL panels but also passive matrix EL panels,.

An absorption film 107 is formed so as to completely cover the EL element 106 formed on the substrate 101. The absorption film 107 formed here is formed in succession, after film formation of the EL element 106, under an inert gas atmosphere, such as nitrogen or a noble gas.

In addition, an enclosure structure is formed for the sealing substrate 102 by a sealant 108 made from a thermosetting resin or an ultraviolet light setting resin. A region surrounded here by the substrate 101 and the sealing substrate 102 is referred to as a space 109, and the EL element 106 is positioned on the inside of the space 109 having an inert gas. Note that the sealant is prepared in locations so as not to overlap with the absorption film.

The arrow in FIG. 1B denotes the direction in which light emitted from the EL element 106 is discharged. Namely, as a structure of the EL element 106, the anode 103 is formed on the substrate 101 side as seen from the EL layer 105, and the cathode 104 is formed on the sealing substrate 102 side.

By switching the cathode and the anode in the element structure of the EL element, it is possible to reverse the light discharge direction compared to that of the arrow. However, the transmitting of the absorption film 107 used in the present invention drops along with the amount of moisture absorbed, and therefore it is preferable to make an element structure like that shown in FIG. 1B.

Note that a case of forming one EL panel from one substrate is explained in FIGS. 1A and 1B. It is also possible to apply the present invention to cases in which a plurality of panels are formed from one substrate.

The absorption film 107 is then formed in succession after forming the EL element 106. The absorption film 107 formed here is formed by a metal having a low work coefficient. Note that the term metal having a low work coefficient as used herein indicates a metal showing a work coefficient in a range of 2.0 to 4.0 eV.

Further, considering film formation temperature, it is preferable that the absorption film 107 used in the present invention be formed by evaporation. It is also possible to use CVD or sputtering for film formation provided that low temperature processing is possible.

Next, after the absorption film 107 is formed, enclosure is performed under an inert gas atmosphere. Materials such as glass, quartz, plastics (including plastic films), metals (typically stainless steel), and ceramics can be used as the sealing substrate 102 used in the enclosure. Note that FRP (fiberglass reinforced plastics), PVF (polyvinyl fluoride) films, Mylar films, polyester films, and acrylic resin films can be used as plastics.

Even if contaminants such as oxygen and moisture are mixed in the space formed by enclosure in the above structure, direct intrusion by the contaminants to the EL element 106 can be prevented with the present invention. Preferably, the EL element is enclosed by the substrate and the absorption film so that the EL element is prevented from contacting the atmosphere of the space 109. Deterioration of the EL element 106 due to oxygen and moisture can therefore be suppressed.

Embodiments

Embodiments of the present invention are explained below.

Embodiment 1

Figure 2:
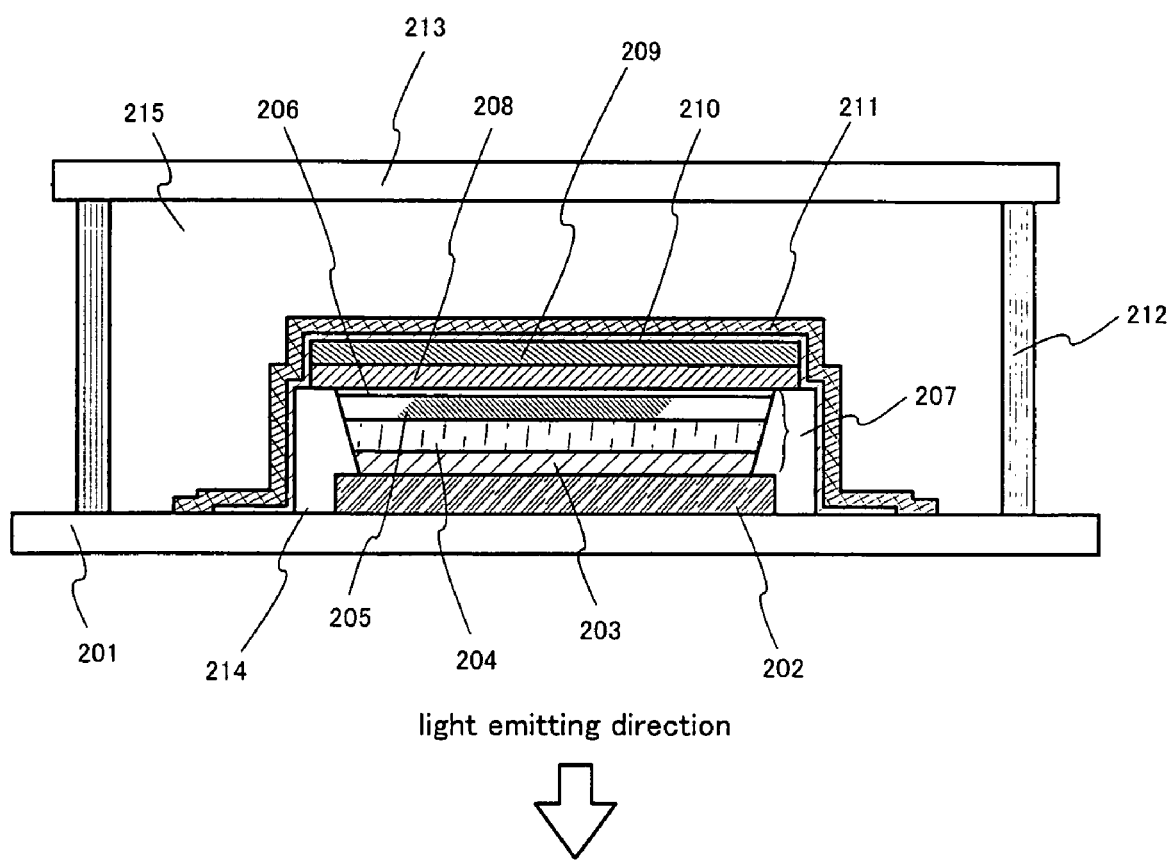
FIG. 2 is a diagram for explaining an element structure of an EL element in the present invention.

A schematic diagram of an element structure of an EL element used in implementing the present invention is shown in FIG. 2. Reference numeral 201 denotes a substrate in FIG. 2, and light transmitting materials such as glass and quartz can be used for the substrate 201. Further, reference numeral 202 denotes an anode. The anode 202 is formed by ITO, an alloy of tin oxide and indium oxide, but chemical compounds in which from 2 to 20% of zinc oxide (ZnO) is mixed into indium oxide, and chemical compounds made from zinc oxide and calcium oxide may also be used. Furthermore, edge portions of the anode 202 are covered by an insulating film 214 made from an insulating material.

An EL layer 207 is formed next having a lamination structure made from a hole injecting layer 203, a hole transporting layer 204, a light emitting layer 205, and a buffer layer 206. Specifically, copper phthalocyanine (Cu-Pc) and PEDOT, which is a polythiophene derivative, can be used in forming the hole injecting layer 203.

Note that the hole injecting layer 203 may be formed by evaporation for cases of using a low molecular weight material such as copper phthalocyanine, and may be formed by spin coating or inkjet printing for cases of using a high molecular weight material such as PEDOT. Further, MTDATA and á-NPD can be used as the hole transporting layer 204.

Next, a known organic EL material can be used as the light emitting layer 205, and high molecular weight EL materials and low molecular weight EL materials can be used. Note that a case of forming a light emitting layer composed of three colors, a red color light emitting layer for displaying red color emitted light, a green color light emitting layer for displaying green color emitted light, and a blue color light emitting layer for displaying blue color emitted light, is explained in embodiment 1.

The red color light emitting layer can be formed using $Alq_3$ doped with DCM. In addition, it can also be formed using a material such as an Eu complex ($Eu(DCM)_3(Phen)$), or an aluminum quinolinolate complex ($Alq_3$) doped with DCM-1. Next, the green color light emitting layer can be formed by common evaporation of CPB and Ir(ppy)3. Note that aluminum quinolinolate complex ($Alq_3$) and benzo-quinolinolate beryllium (BeBq) can also be used. In addition, it is also possible to use a material such as aluminum quinolinolate complex ($Alq_3$) into which coumarin 6 or quinacridon is doped can be used. The blue color light emitting layer can be formed by using DPVBi, which is a distyrylarylene derivative, a zinc complex possessing an azomethine compound in its ligands, or DPVBi doped with perillin.

Furthermore, materials such as lithium fluoride (LiF), aluminum oxide ($Al_2O_3$), and lithium acetyl acetate can be used as the buffer layer 206.

The lamination structure of the EL layer 207 is thus complete. Note that the EL layers may be formed using evaporation if formed using low molecular weight materials, and further, may be formed using a process such as an application process like spin coating and ink jet printing, or by a process such as printing.

A cathode 208 is formed next on the EL layer 207. Considering that electrons are injected from the cathode, it is necessary to use a metallic material having a low work coefficient. However, low work coefficient metals are unstable in the atmosphere, and oxidation and peeling become problems. Consequently, it is effective to use an alloy (MgAg) formed by common evaporation of magnesium (Mg) and silver (Ag) in a 9:1 ratio. Further, an alloy of aluminum, lithium or calcium, and magnesium may also be used. It is also possible to use ytterbium (Yb).

A protective electrode 209 is formed from silver (Ag) in embodiment 1 with the aim of lowering the cathode resistance and suppressing cathode oxidation. Note that it is not always necessary to form the protective electrode, and it need not be formed depending upon the circumstances.

A barrier layer 210 is formed next. The barrier layer 210 is formed in order to prevent oxygen and moisture absorbed by the absorption layer from directly contacting the cathode. Note that it is not always necessary to form the barrier layer, and it need not be formed if not needed. Note also that an insulating material, specifically copper phthalocyanine, silicon nitride, or silicon oxide, may be used as the material for forming the barrier film.

An absorption film 211 is formed on the barrier film 210. A metal having a low work coefficient is used as the absorption film 211. This is because low work coefficient metals easily oxidize. In addition, a metal in which the oxide produced by the oxidation takes in moisture to become a hydrate is used here. Specifically, barium (Ba) can be used. Barium is known to react with oxygen and water as follows:

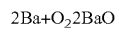

Namely, barium has a function of reacting with and taking in oxygen, moisture and the like existing in the space, according to this chemical equation. In other words, this chemical behavior is effectively utilized as a chemical absorption film.

Further, it is preferable to perform film formation of the EL layer 207, the cathode 208, the protective electrode 209, the barrier film 210, and the absorption film 211 such that oxygen and moisture are not contained in the interfaces between films. It is therefore necessary for the films to be formed in succession under a vacuum, or that there is no contact with oxygen or moisture after forming the EL layer 207 under an inert gas atmosphere, such as that of nitrogen or a noble gas.

It is possible to perform film formation like that stated above with a film formation apparatus using a multi-chamber method (cluster tool method) in embodiment 1.

After thus performing film formation, a sealing substrate 213 is bonded to the substrate 201 using a sealant 212. An ultraviolet setting resin is used in this embodiment as the sealant 212. A region surrounded by the substrate 201, the sealing substrate 213, and the sealant 212 refers to a space 215.

Materials such as glass, quartz, plastics (including plastic films), and metallic typically stainless steels) ceramics can be used as the sealing substrate. Note that FRP fiberglass reinforced plastics) plate, PVF (polyvinyl fluoride) films, Mylar films, polyester films, and acrylic resin films can be used as plastics.

Evaluation of the state of deterioration of the EL element from the time of panel manufacture was performed based on the brightness obtained versus the voltage applied to the EL elements in an EL panel having the above stated enclosure structure. Note that, although not shown in FIG. 2, the cathode and the anode of the EL element are each electrically connected to an external electric power source.

Further, the element structure of the EL elements used in evaluation is as shown below. First, an EL layer is formed after forming an anode on a glass substrate by using ITO. The EL layer has a lamination structure as shown below.

After first forming a hole injecting layer by forming copper phthalocyanine with a film thickness of 20 nm, (4,4',4"-tris (3-methylphenylphenylamino)triphenylamine), hereafter referred to as MTDATA, is formed with a film thickness of 20 nm and 4,4'-bis(N-(1-naphthyl)-N-phenylamino)-biphenyl, hereafter referred to as á-NPD) is formed having a film thickness of 10 nm, as a hole transporting layer. Tris-(8-quinolinolate) aluminum (hereafter referred to as $Alq_3$) is formed next with a film thickness of 50 nm as a light emitting layer, and lithium acetyl acetonate (hereafter referred to as Liacac) is formed having a film thickness of 2 nm as a buffer layer. The EL layer is thus formed.

Mg:Ag is formed next with a 150 nm film thickness as a cathode, and Ag is formed with a 150 film thickness on the Mg:Ag film as a protective electrode. A structure in which the EL element is formed up through this point is sealed under a nitrogen atmosphere by the glass substrate and an ultraviolet setting resin is referred to as "no Ba". In addition, a structure sealed under a nitrogen atmosphere by the glass substrate and an ultraviolet setting resin after forming copper phthalocyanine with a thickness of 20 nm on the protective electrode as a barrier film, and forming barium having a film thickness of 1500 nm on the barrier film, is referred to as "having Ba".

Figure 3:
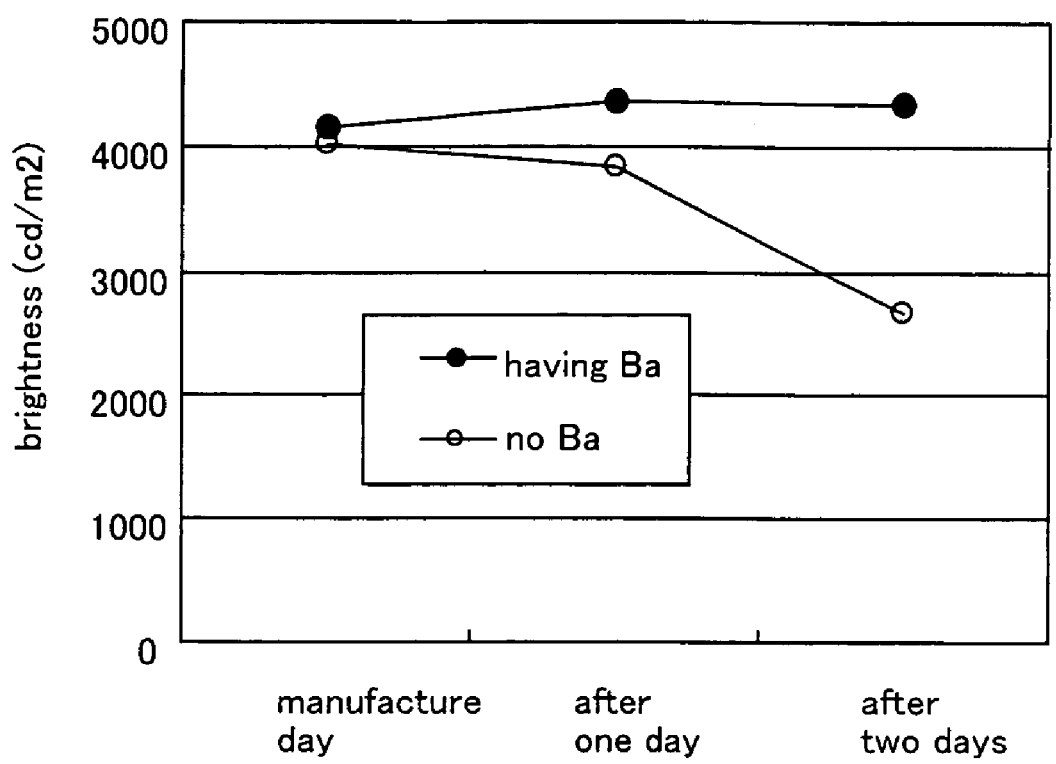
FIG. 3 is a diagram showing an effect of implementing the present invention.

Results obtained here are shown in FIG. 3. With the initial properties of the manufactured EL element taken as those of the day of manufacture, results measured after exposing the EL element to high temperature, high humidity conditions of a temperature of 60° C. and 95% humidity for one day, and measured after exposure for two days, are respectively shown by 1-day and 2-day symbols in the figure. Note that the drive voltage here is set to 7 V.

It can be seen from the results of FIG. 3 that the brightness falls slightly after one day for the "no Ba" EL element, and has fallen by over 1000 candela after two days. On the other hand, the "having Ba" EL element shows almost no drop in brightness even after two days.

Figure 11A:
FIGS. 11A to 11C are photographs showing the deterioration of EL layers.
Figure 11B:
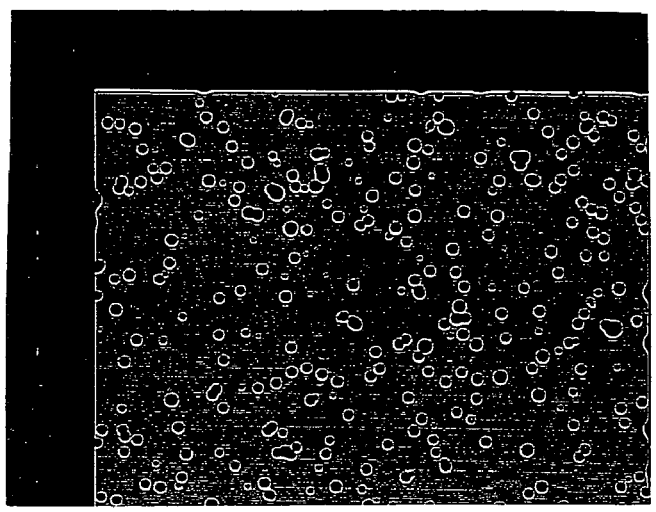
Figure 11C:
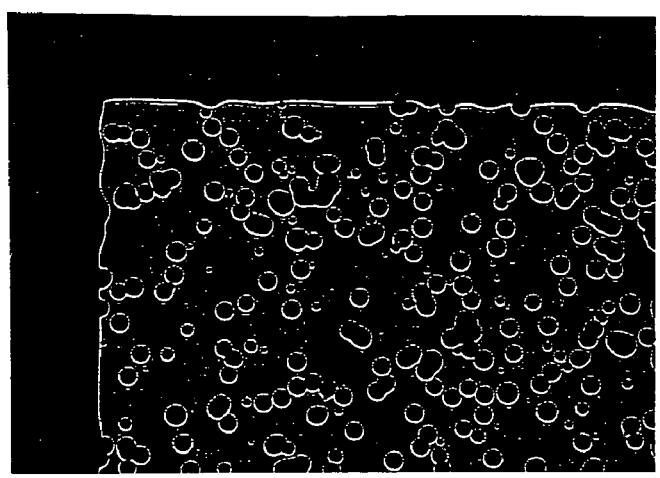
Figure 12A:
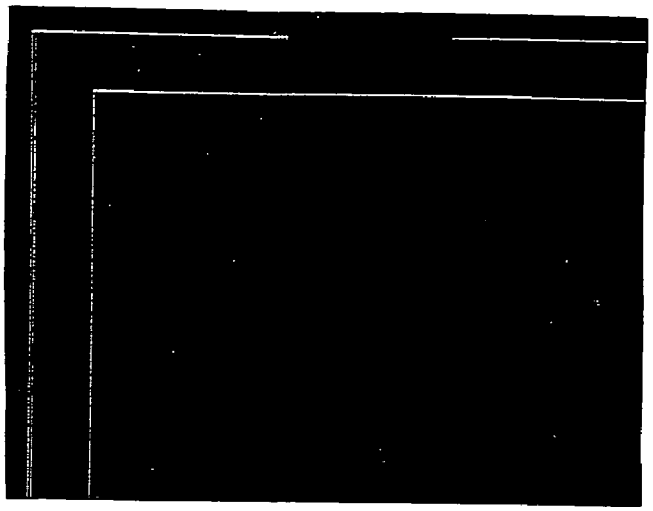
FIGS. 12A to 12C are photographs showing deterioration of EL layers.
Figure 12B:
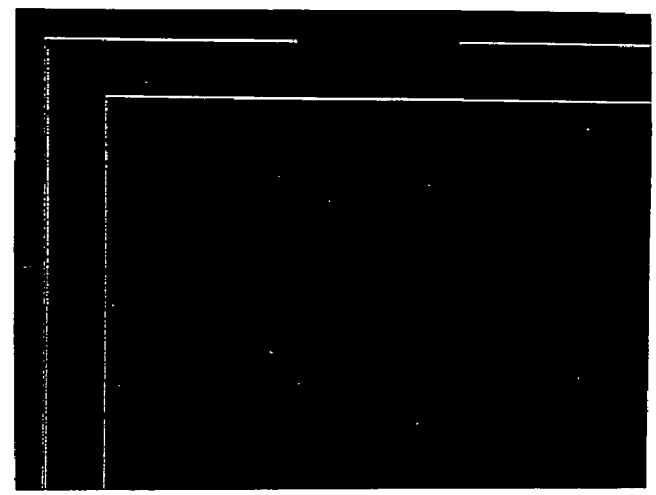
Figure 12C:
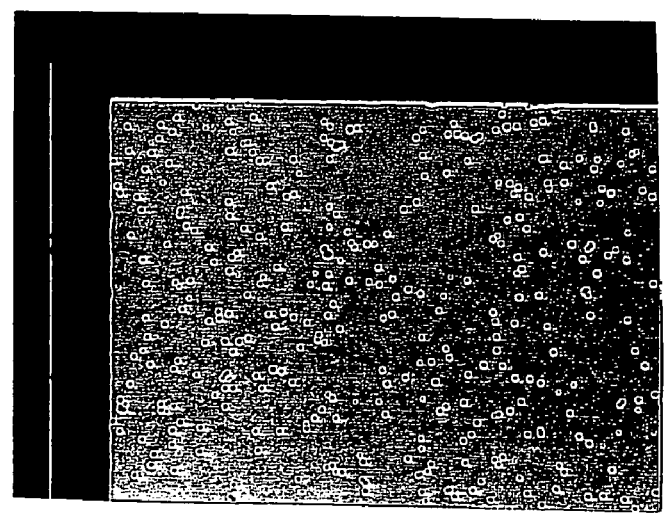

In addition, photographs of the "no Ba" EL element observed here are shown in FIGS. 11A to 11C, while photographs of the "having Ba" EL element are shown in FIGS. 12A to 12C. Note that, the state of the EL elements immediately after manufacture are shown in FIGS. 11A and 12A, the states after exposure to high temperature and high humidity for one day are shown in FIGS. 11B and 12B, and the states after exposure for two days are shown in FIGS. 11C and 12C, respectively.

In FIGS. 11A to 11C, a state showing deterioration of the "no Ba" EL element is already confirmed after one day, while no element deterioration can be seen after one day for the "having Ba" EL element in FIGS. 12A to 12C. After the second day, indications of slight deterioration can be seen, but it is understood that the EL element deterioration for the "having Ba" EL element is slower. The suppression of EL element deterioration by the formation of an absorption film made from barium is thus confirmed.

Embodiment 2

Next, the case of using the present invention to the light-emitting device of an active matrix type is explained in this embodiment. Here, a method of simultaneously manufacturing TFTs (n-channel TFT and p-channel TFT) in a pixel portion and a driver circuit provided in the periphery of the pixel portion on the same substrate and also manufacturing an EL element is described in detail with reference to FIG. 4A to FIG. 7.

First, in this embodiment, a substrate 300 is used, which is made of glass such as barium borosilicate glass or alumino borosilicate glass, typified by #7059 glass or #1737 glass of Corning Inc. There is no limitation on the substrate 300 as long as a substrate having a light transmitting property is used, and a quartz substrate may also be used. In addition, a plastic substrate having heat resistance to a treatment temperature of this embodiment may also be used.

Then, a base film 301 formed of an insulating film such as a silicon oxide film, a silicon nitride film or a silicon oxide nitride film is formed on the substrate 300. In this embodiment, a two-layer structure is used for the base film 301. However, a single layer film or a lamination structure consisting of two or more layers of the insulating film may also be used. As a first layer of the base film 301, a silicon oxide nitride film 301a is formed with a thickness of 10 to 200 nm (preferably 50 to 100 nm) using $SiH_4$, $NH_3$, and $N_2O$ as reaction gases by a plasma CVD method. In this embodiment, the silicon oxide nitride film 301a (composition ratio Si=32%, O=27%, N=24% and H=17%) having a film thickness of 50 nm is formed. Then, as a second layer of the base film 301, a silicon oxide nitride film 301b is formed so as to be laminated on the first layer with a thickness of 50 to 200 nm (preferably 100 to 150 nm) using $SiH_4$ and $N_2O$ as reaction gases by the plasma CVD method. In this embodiment, the silicon oxide nitride film 301b (composition ratio Si=32%, O=59%, N=7% and H=2%) having a film thickness of 100 nm is formed.

Subsequently, semiconductor layers 302 to 306 are formed on the base film. The semiconductor layers 302 to 306 are formed such that a semiconductor film having an amorphous structure is formed by a known method (a sputtering method, an LPCVD method, a plasma CVD method or the like), and is subjected to a known crystallization process (a laser crystallization method, a thermal crystallization method, a thermal crystallization method using a catalyst such as nickel, or the like) to obtain a crystalline semiconductor film, and the crystalline semiconductor film is patterned into desired shapes. The semiconductor layers 302 to 306 are formed with a thickness of 25 to 80 nm (preferably 30 to 60 nm). The material of the crystalline semiconductor film is not particularly limited, but it is preferable to form the film using silicon, a silicon germanium ($Si_xGe_{1-x}$ (X=0.0001 to 0.02)) alloy, or the like. In this embodiment, an amorphous silicon film of 55 nm thickness is formed by a plasma CVD method, and then, a nickel-containing solution is held on the amorphous silicon film. A dehydrogenation process of the amorphous silicon film is performed (at 500° C. for 1 hour), and thereafter a thermal crystallization process is performed (at 550° C. for 4 hours) thereto. Further, to improve the crystallinity, a laser annealing process is performed to for the crystalline silicon film. Then, this crystalline silicon film is subjected to a patterning process using a photolithography method to obtain the semiconductor layers 302 to 306.

Further, after the formation of the semiconductor layers 302 to 306, a minute amount of impurity element (boron or phosphorus) may be doped to control a threshold value of the TFT.

Besides, in the case where the crystalline semiconductor film is manufactured by the laser crystallization method, a pulse oscillation type or continuous emission type excimer laser, YAG laser, or $YVO_4$ laser may be used. In the case where those lasers are used, it is appropriate to use a method in which laser light radiated from a laser oscillator is condensed into a linear shape by an optical system, and is irradiated to the semiconductor film. Although the conditions of crystallization should be properly selected by an operator, in the case where the excimer laser is used, a pulse oscillation frequency is set to 300 Hz, and a laser energy density is set to 100 to 400 $mJ/cm^2$ (typically 200 to 300 $mJ/cm^2$). In the case where the YAG laser is used, it is appropriate to set a pulse oscillation frequency as 30 to 300 Hz using the second harmonic, and to set a laser energy density to 300 to 600 $mJ/cm^2$ (typically, 350 to 500 $mJ/cm^2$). Then, laser light condensed into a linear shape with a width of 100 to 1000 μm, for example, 400 μm, is irradiated to the whole surface of the substrate, and an overlapping ratio (overlap ratio) of the linear laser light at this time may be set to 50 to 90%.

A gate insulating film 307 is then formed for covering the semiconductor layers 302 to 306. The gate insulating film 307 is formed of an insulating film containing silicon with a thickness of 40 to 150 nm by a plasma CVD or sputtering method. In this embodiment, the gate insulating film 307 is formed of a silicon oxide nitride film with a thickness of 110 nm by the plasma CVD method (composition ratio Si=32%, O =59%, N=7%, and H=2%). Of course, the gate insulating film is not limited to the silicon oxide nitride film, and other insulating films containing silicon may be used with a single layer or a lamination structure.

Besides, when a silicon oxide film is used, it can be formed such that TEOS (tetraethyl orthosilicate) and $O_2$ are mixed by the plasma CVD method with a reaction pressure of 40 Pa and a substrate temperature of 300 to 400° C., and discharged at a high frequency (13.56 MHz) power density of 0.5 to 0.8 W/cm². The silicon oxide film thus manufactured can obtain satisfactory characteristics as the gate insulating film by subsequent thermal annealing at 400 to 500° C.

Figures 4A, 4B, 4C:
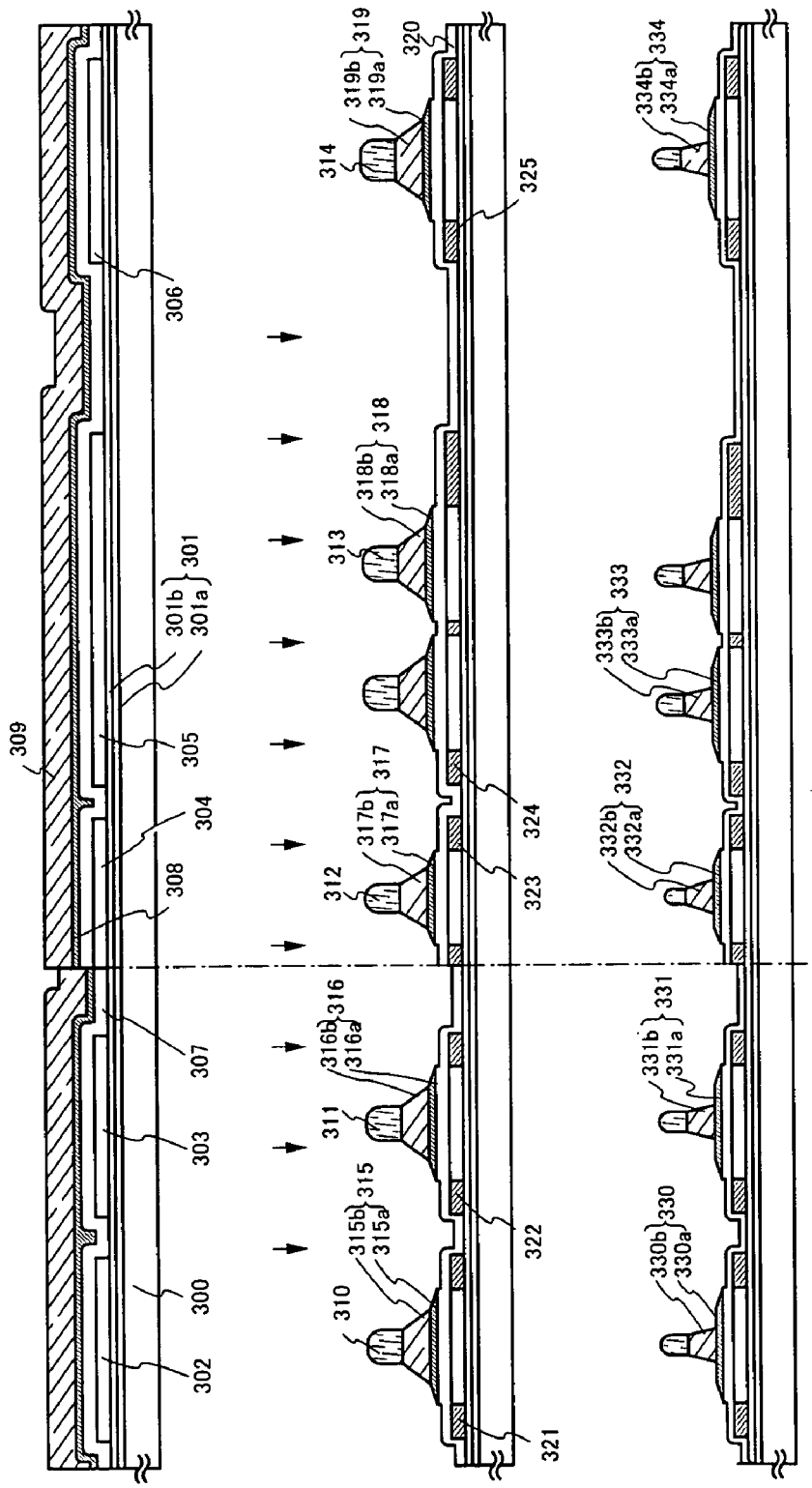
FIGS. 4A to 4C are diagrams showing a process of manufacturing a pixel TFT and driver circuit TFTs.

Then, as shown in FIG. 4A, a first conductive film 308 of 20 to 100 nm thickness and a second conductive film 309 of 100 to 400 nm thickness are formed into lamination on the gate insulating film 307. In this embodiment, the first conductive film 308 made of a TaN film with a thickness of 30 nm and the second conductive film 309 made of a W film with a thickness of 370 nm are formed into lamination. The TaN film is formed by sputtering with a Ta target under a nitrogen containing atmosphere. Besides, the W film is formed by sputtering with a W target. The W film may also be formed by a thermal CVD method using tungsten hexafluoride ($WF_6$). Whichever method is used, it is necessary to make the material have low resistance for use as a gate electrode, and it is preferred that the resistivity of the W film is set to 20 μΩcm or less. It is possible to make the W film have low resistance by making the crystal grains large. However, in the case where many impurity elements such as oxygen are contained within the W film, crystallization is inhibited and the resistance becomes higher. Therefore, in this embodiment, the W film is formed by sputtering using a W target having a high purity of 99.9999%, and also by taking sufficient consideration so as to prevent impurities within the gas phase from mixing therein during the film formation, and thus, a resistivity of 9 to 20 μΩcm can be realized.

Note that, in this embodiment, the first conductive film 308 is made of TaN, and the second conductive film 309 is made of W, but the material is not particularly limited thereto, and either film may be formed from an element selected from the group consisting of Ta, W, Ti, Mo, Al, Cu, Cr, and Nd or an alloy material or a compound material containing the above element as its main constituent. Besides, a semiconductor film typified by a polycrystalline silicon film doped with an impurity element such as phosphorus may be used. An alloy made of Ag, Pd, and Cu may also be used. Further, any combination may be employed such as a combination in which the first conductive film is formed of a tantalum (Ta) film and the second conductive film is formed of a W film, a combination in which the first conductive film is formed of a titanium nitride (TiN) film and the second conductive film is formed of a W film, a combination in which the first conductive film is formed of a tantalum nitride (TaN) film and the second conductive film is formed of an Al film, or a combination in which the first conductive film is formed of a tantalum nitride (TaN) film and the second conductive film is formed of a Cu film.

Next, as shown in FIG. 4B, masks 310 to 314 made of resist are formed by using a photolithography method, and a first etching process for forming electrodes and wirings is carried out. In the first etching process, first and second etching conditions are used. In this embodiment, as the first etching condition, an ICP (inductively coupled plasma) etching method is used, in which $CF_4$, $Cl_2$, and $O_2$ are used as etching gases, a gas flow rate is set to 25/25/10 sccm, and an RF (13.56 MHz) power of 500 W is applied to a coil shape electrode under a pressure of 1 Pa to generate plasma. Thus, the etching is performed. A dry etching device using ICP (Model E645-ICP) manufactured by Matsushita Electric Industrial Co. is used here. A 150 W RF (13.56 MHz) power is also applied to the substrate side (sample stage), thereby substantially applying a negative self-bias voltage. The W film is etched under the first etching condition, and the end portion of the first conductive layer is formed into a tapered shape. In the first etching condition, the etching rate for W is 200.39 nm/min, the etching rate for TaN is 80.32 nm/min, and the selectivity of W to TaN is about 2.5. Further, the taper angle of W is about 26° under the first etching condition.

Thereafter, as shown in FIG. 4B, the etching condition is changed into the second etching condition without removing the masks 310 to 314 made of resist, and the etching is performed for about 30 seconds, in which $CF_4$ and $Cl_2$ are used as the etching gases, a gas flow rate is set to 30/30 sccm, and an RF (13.56 MHz) power of 500 W is applied to a coil shape electrode under a pressure of 1 Pa to generate plasma. An RF (13.56 MHz) power of 20 W is also applied to the substrate side (sample stage), and a substantially negative self-bias voltage is applied thereto. In the second etching condition in which $CF_4$ and $Cl_2$ are mixed, the W film and the TaN film are etched to the same degree. In the second etching condition, the etching rate for W is 58.97 nm/min, and the etching rate for TaN is 66.43 nm/min. Note that, in order to perform the etching without leaving any residue on the gate insulating film, it is appropriate that an etching time is increased by approximately 10 to 20%.

In the above first etching process, by making the shapes of the masks formed of resist suitable, end portions of the first conductive layer and the second conductive layer become tapered shape by the effect of the bias voltage applied to the substrate side. The angle of the taper portion may be 15 to 45°. In this way, first shape conductive layers 315 to 319 consisting of the first conductive layer and the second conductive layer (first conductive layers 315a to 319a and second conductive layers 315b to 319b) are formed by the first etching process. Reference numeral 320 indicates a gate insulating film, and the regions not covered with the first shape conductive layers 315 to 319 are made thinner by approximately 20 to 50 nm by etching.

Then, a first doping process is performed to add an impurity element imparting n-type conductivity to the semiconductor layer without removing the masks made of resist (FIG. 4B). Doping may be carried out by an ion doping method or an ion injecting method. The condition of the ion doping method is that a dosage is $1\times10^{13}$ to $5\times10^{15}$ atoms/cm², and an acceleration voltage is 60 to 100 keV. In this embodiment, the dosage is $1.5\times10^{15}$ atoms/cm² and the acceleration voltage is 80 keV. As the impurity element imparting n-type conductivity, an element belonging to group 15 of the periodic table, typically phosphorus (P) or arsenic (As) is used, but phosphorus (P) is used here. In this case, the conductive layers 315 to 319 become masks for the impurity element imparting n-type conductivity, and high concentration impurity regions 321 to 325 are formed in a self-aligning manner. The impurity element imparting n-type conductivity in a concentration range of $1\times10^{20}$ to $1\times10^{21}$ atoms/cm³ is added to the high concentration impurity regions 321 to 325.

Thereafter, as shown in FIG. 4C, a second etching process is performed without removing the masks made of resist. Here, a gas mixture of $CF_4$, $Cl_2$ and $O_2$ is used as an etching gas, the gas flow rate is set to 20/20/20 sccm, and a 500 W RF (13.56 MHz) power is applied to a coil shape electrode under a pressure of 1 Pa to generate plasma, thereby performing etching. A 20 W RF (13.56 MHz) power is also applied to the substrate side (sample stage), thereby substantially applying a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° by the second etching process. Second conductive layers 330b to 334b are formed by the second etching process.

On the other hand, the first conductive layers 315a to 319a are hardly etched, and first conductive layers 330a to 334a are formed.

Next, a second doping process is performed. The second conductive layers 330b to 334b are used as masks for an impurity element, and doping is performed such that the impurity element is added to the semiconductor layer below the tapered portions of the first conductive layers. In this embodiment, phosphorus (P) is used as the impurity element, and plasma doping is performed with a dosage of $1.5\times10^{14}$ atoms/cm$^2$, a current density of 0.5 µA, and an acceleration voltage of 90 keV. Thus, low concentration impurity regions 340 to 344, which overlap with the first conductive layers, are formed in self-aligning manner. The concentration of phosphorus (P) added to the low concentration impurity regions 340 to 344 is $1\times10^{17}$ to $5\times10^{18}$ atoms/cm$^3$, and has a gentle concentration gradient in accordance with the film thickness of the tapered portions of the first conductive layers. Note that in the semiconductor layers that overlap with the tapered portions of the first conductive layers, the concentration of the impurity element slightly falls from the end portions of the tapered portions of the first conductive layers toward the inner portions, but the concentration keeps almost the same level. Further, an impurity element is added to the high concentration impurity regions 321 to 325 to form high concentration impurity regions 345 to 349.

Thereafter, as shown in FIG. 5B, after the masks made of resist are removed, a third etching process is performed using a photolithography method. The tapered portions of the first conductive layers are partially etched so as to have shapes overlapping the second conductive layers in the third etching process. Incidentally, as shown in FIG. 5B, masks made of resist (350, 351) are formed in the regions where the third etching process is not conducted.

The etching condition in the third etching process is that Cl$_2$ and SF$_6$ are used as etching gases, the gas flow rate is set to 10/50 sccm, and the ICP etching method is used as in the first and second etching processes. Note that, in the third etching process, the etching rate for TaN is 111.2 nm/min, and the etching rate for the gate insulating film is 12.8 nm/min.

In this embodiment, a 500 W RF (13.56 MHz) power is applied to a coil shape electrode under a pressure of 1.3 Pa to generate plasma, thereby performing etching. A 10 W RF (13.56 MHz) power is also applied to the substrate side (sample stage), thereby substantially applying a negative self-bias voltage. Thus, first conductive layers 352a to 354a are formed.

Impurity regions (LDD regions) 355 to 357, which do not overlap the first conductive layers 352a to 354a, are formed by the above-mentioned third etching process. Note that impurity regions (GOLD regions) 340 and 342 remains overlapping the first conductive layers 330a and 332a.

Further, the electrode constituted of the first conductive layer 330a and the second conductive layer 330b finally becomes the gate electrode of the n-channel TFT of the driver circuit, and the electrode constituted of the first conductive layer 352a and a second conductive layer 352b finally becomes the gate electrode of the p-channel TFT of the driver circuit.

Similarly, the electrode constituted of the first conductive layer 353a and a second conductive layer 353b finally becomes the gate electrode of the n-channel TFT of the pixel portion, and the electrode constituted of the first conductive layer 354a and a second conductive layer 354b finally becomes the gate electrode of the p-channel TFT of the pixel portion. Further, the electrode constituted of the first conductive layer 332a and the second conductive layer 332b finally becomes one of electrodes of a capacitor (storage capacitor) of the pixel portion.

In this way, in this embodiment, the impurity regions (LDD regions) 355 to 357 that do not overlap the first conductive layers 352a to 354a and the impurity regions (GOLD regions) 340 and 342 that overlap the first conductive layers 330a and 332a can be simultaneously formed. Thus, different impurity regions can be formed in accordance with the TFT characteristics.

Next, after the masks 350 and 351 made of resist are removed, the gate insulating film 320 is subjected to an etching process. In this etching process, CHF$_3$ is used as an etching gas, and a reactive ion etching method (RIE method) is used. In this embodiment, a fourth etching process is conducted with a chamber pressure of 6.7 Pa, RF power of 800 W, and a gas flow rate of CHF$_3$ of 35 sccm. Thus, parts of the high concentration impurity regions 345 to 349 are exposed, and insulating films 360 to 364 are formed.

Subsequently, masks 365 and 366 made of resist are newly formed to thereby perform a third doping process. By this third doping process, impurity regions 370 to 375 added with an impurity element imparting conductivity (p-type) opposite to the above conductivity (n-type) are formed in the semiconductor layers that become active layers of the p-channel TFT (FIG. 5C). The first conductive layers 352a, 332a, and 354a are used as masks for the impurity element, and the impurity element imparting p-type conductivity is added to form the impurity regions in a self-aligning manner.

In this embodiment, the impurity regions 370 to 375 are formed by an ion doping method using diborane (B$_2$H$_6$). The impurity regions 370 to 375 are respectively added with phosphorous at different concentrations by the first doping process and the second doping process. In any of the regions, the doping process is conducted such that the concentration of the impurity element imparting p-type conductivity becomes $2\times10^{20}$ to $2\times10^{21}$ atoms/cm$^3$. Thus, the impurity regions function as source and drain regions of the p-channel TFT, and therefore, no problem occurs.

Through the above-described processes, the impurity regions are formed in the respective semiconductor layers. Note that, in this embodiment, a method of conducting doping of the impurities (boron) after etching the gate insulating film is shown, but doping of the impurities may be conducted before etching the gate insulating film and without the etching of the gate insulating film.

Subsequently, the masks 365 and 366 made of resist are removed, and as shown in FIG. 6A, a first interlayer insulating film 376 is formed. As the first interlayer insulating film 376, an insulating film containing silicon is formed with a thickness of 100 to 200 nm by a plasma CVD method or a sputtering method. In this embodiment, a silicon oxide nitride film of 150 nm thickness is formed by the plasma CVD method. Of course, the first interlayer insulating film 376 is not limited to the silicon oxide nitride film, and other insulating films containing silicon may be used in a single layer or a lamination structure.

Then, a process of activating the impurity element added to the semiconductor layers is performed. This activation process is performed by a thermal annealing method using an annealing furnace. The thermal annealing method may be performed in a nitrogen atmosphere with an oxygen concentration of 1 ppm or less, preferably 0.1 ppm or less and at 400 to 700° C., typically 500 to 550° C. In this embodiment, the activation process is conducted by a heat treatment for 4 hours at 550° C. Note that, in addition to the thermal annealing method, a laser annealing method or a rapid thermal annealing method (RTA method) can be applied:

Note that, in this embodiment, with the above-mentioned activation process, nickel used as a catalyst in crystallization is gettered to the impurity regions (345, 348, 370, 372 and 374) containing phosphorous at high concentration, and the nickel concentration in the semiconductor layer that becomes a channel forming region is mainly reduced. The TFT thus manufactured having the channel forming region has the lowered off current value and good crystallinity to obtain a high electric field effect mobility. Thus, the satisfactory characteristics can be attained.

Further, the activation process may be conducted before the formation of the first interlayer insulating film. Incidentally, in the case where the used wiring material is weak to heat, the activation process is preferably conducted after the formation of the interlayer insulating film (insulating film containing silicon as its main constituent, for example, silicon nitride film) in order to protect wirings and the like as in this embodiment.

Furthermore, after the activation process, the doping process is performed, thus the first interlayer insulating film may be formed.

Moreover, a heat treatment is carried out at 300 to 550° C. for 1 to 12 hours in an atmosphere containing hydrogen of 3 to 100% to perform a process of hydrogenating the semiconductor layers. In this embodiment, the heat treatment is conducted at 410° C. for 1 hour in a nitrogen atmosphere containing hydrogen of approximately 3%. This is a process of terminating dangling bonds in the semiconductor layer by hydrogen included in the interlayer insulating film. As another means for hydrogenation, plasma hydrogenation (using hydrogen excited by plasma) may be performed.

In addition, in the case where the laser annealing method is used as the activation process, after the hydrogenation process, laser light emitted from an excimer laser, a YAG laser or the like is desirably irradiated.

Next, as shown in FIG. 6B, a second interlayer insulating film 380, which is made from an organic insulating material, is formed on the first interlayer insulating film 376. In this embodiment, an acrylic resin film is formed with a thickness of 1.6 μm. Then, patterning for forming contact holes that reach the respective impurity regions 345, 348, 370, 372 and 374 is conducted.

As the second interlayer insulating film 380, a film made from an insulating material containing silicon or an organic resin is used. As the insulating material containing silicon,- silicon oxide, silicon nitride, or silicon oxide nitride may be used. As the organic resin, polyimide, polyamide, acrylic, BCB (benzocyclobutene), or the like may be used.

In this embodiment, the silicon oxide nitride film formed by a plasma CVD method is formed. Note that the thickness of the silicon oxide nitride film is preferably 1 to 5 μm (more preferably 2 to 4 μm). The silicon oxide nitride film has a little amount of moisture contained in the film itself, and thus, is effective in suppressing deterioration of the EL element.

Further, dry etching or wet etching may be used for the formation of the contact holes. However, taking the problem of electrostatic destruction in etching into consideration, the wet etching method is desirably used.

Moreover, in the formation of the contact holes here, the first interlayer insulating film 376 and the second interlayer insulating film 380 are etched at the same time. Thus, in consideration for the shape of the contact hole, it is preferable that the material with an etching speed faster than that of the material for forming the first interlayer insulating film 376 is used for the material for forming the second interlayer insulating film 380.

Then, wirings 381 to 388, which are electrically connected with the impurity regions 345, 348, 370, 372 and 374, respectively, are formed. The wirings are formed by patterning a lamination film of a Ti film of 50 nm thickness and an alloy film (alloy film of Al and Ti) of 500 nm thickness, but other conductive films may also be used.

Subsequently, a transparent conductive film is formed thereon with a thickness of 80 to 120 nm, and by patterning the transparent conductive film, a pixel electrode 389 is formed (FIG. 6B).

Note that, in this embodiment, an indium tin oxide (ITO) film or a transparent conductive film in which indium oxide is mixed with zinc oxide (ZnO) of 2 to 20% is used as the transparent electrode.

Further, the pixel electrode 389 is electrically connected to the drain region of the electric current control TFT by forming the pixel electrode 389 so as to contact and overlap with the drain wiring 387.

Figure 7:
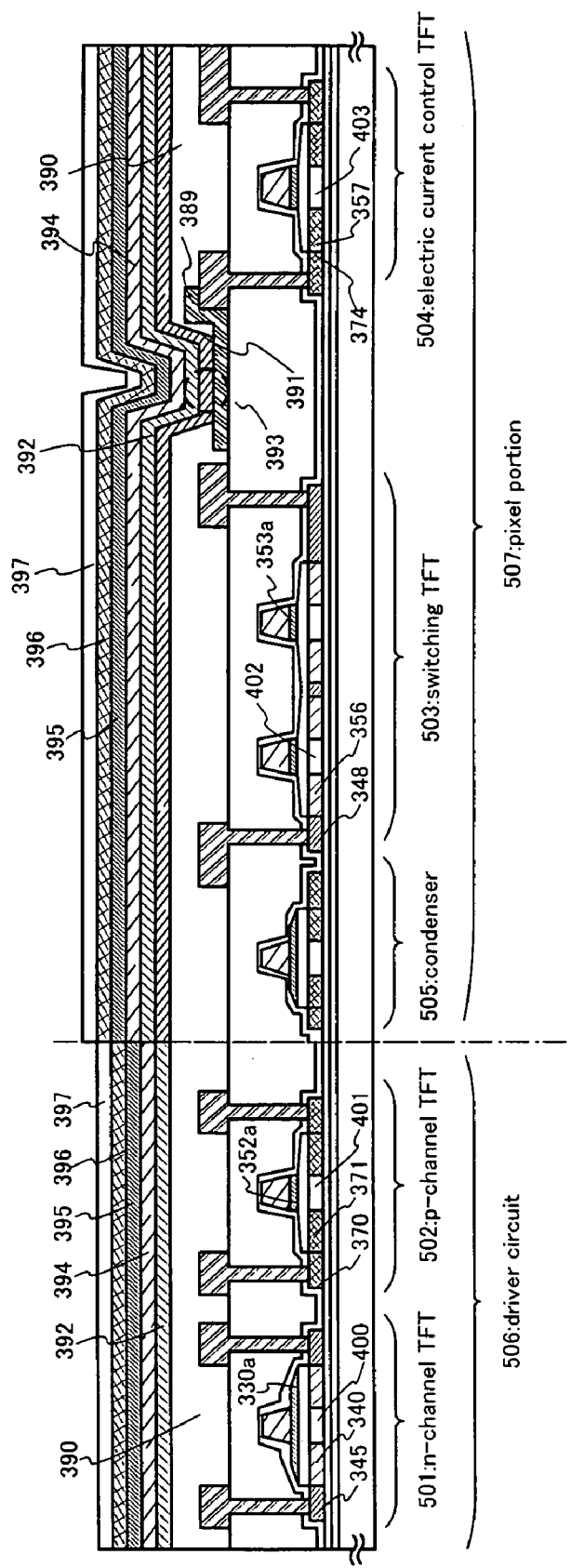
FIG. 7 is a diagram showing the process of manufacturing a pixel TFT and driver circuit TFTs.

Next, as shown in FIG. 7, an insulating film containing silicon (a silicon oxide film in embodiment 2) is formed with a thickness of 500 nm, an opening portion is formed in a position corresponding to the pixel electrode 389, and a third interlayer insulating film 390 which functions as a bank is formed. A taper shape sidewall can easily be made by using wet etching when forming the opening portion. If the sidewall of the opening portion is not sufficiently gentle, then deterioration of the EL layer due to a step becomes a problem, and therefore it is necessary to use care here.

Note that, although a film made from silicon oxide is used as the third interlayer insulating film 390 in embodiment 2, organic resin films such as those formed from polyimide, polyamide, acrylic, and BCB (benzocyclobutene) can also be used, depending upon the circumstances.

An EL layer 391 is formed next by evaporation, as shown in FIG. 7. One example of the EL layer 391 formed according to the present invention is shown here.

After first forming copper phthalocyanine (hereafter referred to as Cu-Pc) on the pixel electrode (anode) 389 with a film thickness of 20 nm as a hole injecting layer, MTDATA is formed having a film thickness of 20 nm, and á-NPD is formed having a film thickness of 10 nm, as a hole transporting layer. Alq$_3$ is formed next with a film thickness of 50 nm as a light emitting layer, and a 2 nm thickness of Liacac is formed as a buffer layer. The EL layer 391 is thus formed.

Note that known materials can also be used as the materials for forming the EL layer 391. A four layer structure composed of a hole injecting layer, a hole transporting layer, a light emitting layer, and an electron transporting layer is made in embodiment 2, but an electron injecting layer can also be formed, and it is also possible to omit any of these layers except the light emitting layer. Various examples of this type of combination have already been reported upon, and any such combinations may be used.

A cathode (Mg:Ag electrode) 392 and a protective electrode 394 are formed next by evaporation. It is preferable to perform heat treatment in advance on the pixel electrode 380 before forming the EL layer 391 and the cathode 392, thereby completely removing moisture. Note that, although an Mg:Ag electrode is used as the cathode of the EL element in embodiment 2, other known materials may also be used.

Further, the protective electrode 394 is formed to prevent deterioration of the cathode 392, and to lower the film resistance of the cathode, and metallic films having low resistance with aluminum as the main constituent are typical. Other materials may also be used, of course. Further, it is not always necessary to form the metallic film, and it need not be formed when not necessary.

In addition, a barrier film 395 is formed. The barrier film is formed in order to prevent direct contact of oxygen and moisture, captured by an absorption film formed subsequently, with the cathode and the protective electrode. Note that an insulating film made from Cu-Oc is used as the barrier film in embodiment 2.

The film thickness of the EL layer 391 may be set from 10 to 400 nm (typically between 60 and 150 nm), and the film thickness of the cathode 392 may be set from 80 to 200 nm (typically between 100 and 150 nm).

An absorption film 396 is formed next so as to cover the EL element 393, the protective electrode 394, and the barrier film 395. It is preferable to use a metal having a low work coefficient and possessing absorption properties as the absorption film 396, and barium is used in embodiment 2. Note that the film thickness of the absorption film 396 maybe set from 1 to 3 ìm (typically between 1.5 and 2 ìm).

The EL element 393 is weak with respect to oxygen and moisture, and therefore it is preferable to perform processing in succession from the formation of the EL layer 391 to the formation of the absorption film 396.

In addition, a structure is used in embodiment 2 in which a passivation film 397, composed of an insulating film such as a nitride film or an oxide film, is formed on the absorption film 396 in order to increase the adhesion of a sealant prepared between the sealing substrate and the substrate during sealing. However, it is not always necessary to form the passivation film 397, and it may be formed only when needed.

The structure shown in FIG. 7 is thus complete. A structure manufactured up through that shown in FIG. 7 is referred to as an EL substrate within this specification.

Note that there is emission from the lower surface with the element structure of the EL element 393, and therefore a structure is shown in which an n-channel TFT is used as a switching TFT 503, and a p-channel TFT is used as an electric current control TFT 504. However, this is only a preferred structure in embodiment 2, and there are no limitations placed upon the structure.

Note that the driver voltage of the TFTs used in embodiment 2 is from 1.2 to 10 V, preferably between 2.5 and 5.5 V.

A method for sealing the EL substrate shown in FIG. 7 by using a sealing substrate and completing an EL panel is explained next using FIGS. 8A and 8B.

FIG. 8A is an upper surface diagram of an EL panel having a sealed EL substrate, and FIG. 8B is a cross sectional diagram of FIG. 8A cut along the line A-A'. Reference numeral 801 shown by a dotted line denotes a source side driver circuit, reference numeral 802 denotes a pixel portion, and reference numeral 803 denotes a gate side driver circuit. Further, reference numeral 804 denotes a sealing substrate, reference numeral 805 denotes a sealing material, and the inside portion surrounded by he sealing material 805 is a space 807.

Note that video signals and clock signals are received from an external input terminal FPC (flexible printed circuit) through a wiring (not shown in the figures) for transmitting input signals to the source side driver circuit 801 and to the gate side driver circuit 803. Note also that, although a state in which an FPC is connected to the EL panel is shown, a module in which an IC (integrated circuit) is directly mounted through an FPC is referred to as a light emitting device within this specification.

The cross sectional structure is explained next using FIG. 8B. The pixel portion 802 and the gate side driver circuit 803 are formed above a substrate 810, and the pixel portion 802 is formed by a plurality of pixels including electric current control TFTs 811 and pixel electrodes 812 that are electrically connected to drains of the electric current control TFTs 811. Further, the gate side driver circuit is formed using CMOS circuits (refer to FIG. 7) in which n-channel TFTs 813 and p-channel TFTs 814 are combined.

The pixel electrode 812 functions as an anode. Furthermore, after forming banks 815 in both edges of the pixel electrode 812, an EL layer 816 and a cathode 817 are formed on the pixel electrode 812, forming an EL element 818.

Note that the cathode 817 functions as a common wiring for all pixels, and is electrically connected to the FPC 809 via a connection wiring 808.

A barrier film 819 and an absorption film 820 are formed next in succession so as to cover the EL element 818. Note that the barrier film 819 formed here is formed in order to avoid oxygen and moisture absorbed by the absorption film 820 coming into direct contact with the cathode 817. In addition, it is also formed in order to prevent direct contact pressure from being applied to the EL element 818 by weight developing by oxygen and moisture absorbed by the absorption film 820. It is therefore preferable to use an insulating material as the material for forming the barrier film 819, and silicon nitride and silicon oxide materials are suitable.

A metal having a low work coefficient is used as the absorption film 820. This is because low work coefficient metals easily oxidize. In addition, a metal in which the oxide produced by the oxidation takes in moisture to become a hydrate is used here. Specifically, barium (Ba) can be used.

A passivation film 821 is formed after forming the absorption film 820. The passivation film 821 is formed in order to prevent direct contact between the sealant 805 and the connection wiring 808. The adhesiveness of the sealant 805 can be increased by the passivation film 821.

Note that the sealing substrate 804 made from glass is bonded by the sealant 805. It is preferable to use an ultraviolet setting resin or a thermosetting resin as the sealant 805. Further, spacers made from a resin film may also be formed when necessary in order to maintain a gap between the sealing substrate 804 and the EL element 818. An inert gas such as nitrogen or a noble gas fills the space 807 on the inside of the sealant 805. Furthermore, it is preferable that the sealant 805 be a material which is impermeable to moisture and oxygen.

The EL elements can thus be completely shut off from the outside by sealing the EL elements in the space 807 with a structure like that discussed above, and EL element deterioration due to moisture and oxygen entering from the outside can be prevented. A light emitting device having high reliability can therefore be obtained.

Note that it is possible to implement the constitution of this embodiment by freely combining it with the constitution of embodiment 1.

Embodiment 3

Figure 9:
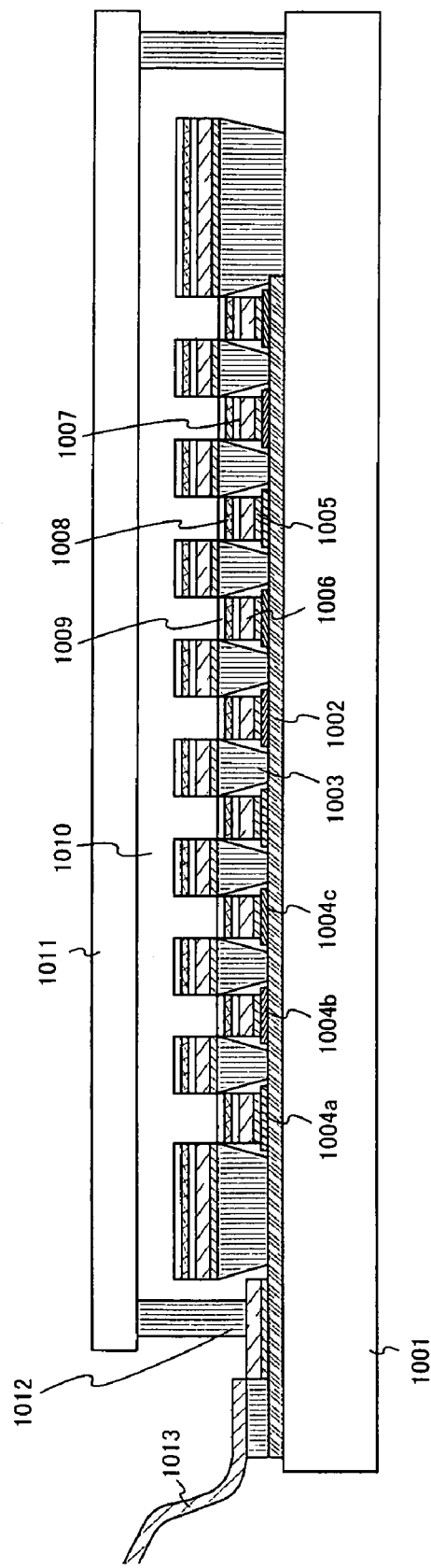
FIG. 9 is a diagram showing a cross sectional structure of a passive matrix light emitting device.

A case of using the present invention in a passive matrix (simple matrix) light emitting device is explained in this embodiment. FIG. 9 is used in the explanation. Reference numeral 1001 denotes a substrate made from glass in FIG. 9, and reference numeral 1002 denotes an anode made from a transparent conductive film. A chemical compound of indium oxide and zinc oxide is formed by sputtering as an anode 1002 in embodiment 3. Note that, although not shown in FIG. 9, a plurality of the anodes 1002 are arranged in a direction parallel to the page. In addition, banks 1003 are formed so as to be buried between the anodes 1002.

Cathodes 1006 arranged in a stripe shape are formed in a vertical direction to the page.

EL layers 1004a to 1004c composed of EL materials are formed next by evaporation, as shown by embodiment 1. Note that the EL layer 1004a is a red color light emitting EL layer, the EL layer 1004b is a green color light emitting layer, and the EL layer 1004c is a blue color light emitting layer. Organic EL materials used here may be similar to those of embodiment 1. The EL layers are formed following the groves formed by the banks 1003, and are thus formed in a form of stripes in a vertical direction with respect to the page.

Three colors of pixels, red, green, and blue, are formed in a form of stripes on the substrate by implementing this embodiment. Note that it is not always necessary to have three colors for the pixels, and one color or two colors may also be used. Further, the colors are not limited to red, green, and blue. Other colors capable of being emitted, such as yellow, orange, and gray, may also be used.

As a method of forming the EL layers, only the red color light emitting EL layer is formed first using a metal mask. After then shifting the metal mask and moving it to the adjacent pixel row, the green color light emitting EL layer is formed. In addition, the blue color light emitting EL layer is formed after moving the metal mask to the adjacent pixel row. EL layers made from red, green, and blue in a form of stripes are thus formed.

Note that the same color light emitting layers may be formed one line at a time, and may also be formed at the same time.

It is preferable that the mutual distance (D) between pixels of the same color that are adjacent to each other on a line be equal to or greater than 5 times the film thickness (t) of the EL layers (more preferably equal to or greater than 10 times). This is because the problem of cross talk occurs when D<5 t. Note that high definition images cannot be obtained if the distance (D) is too large, and therefore 5 t<D<50 t (more preferably, 10 t<D<35 t) is preferable.

The banks may be formed in a form of stripes in a horizontal direction with respect to the page, and the red color light emitting EL layers, the green color light emitting EL layers, and the blue color light emitting EL layers may also be formed in the same horizontal direction, respectively.

In this case it is preferable that the mutual distance (D) between pixels of the same color that are adjacent to each other on a line be equal to or greater than 5 times the film thickness (t) of the EL layers (more preferably equal to or greater than 10 times), and more preferably, 5 t<D<50 t (preferably, 10 t<D<35 t).

It becomes possible to control the film formation position by forming the EL layers using the metal mask, as above.

Next, although not shown in FIG. 9, a plurality of cathode electrodes and the protective electrodes have their longitudinal direction in a vertical direction to the page, and are arranged in a stripe shape such that they intersect with the anode 1002. Note that the cathodes 1005 are made from MgAg in this embodiment, and the protective electrodes 1006 are made from an aluminum alloy film. Both are formed by evaporation. Further, although not shown in the figure, the protective electrodes 1006 have wirings drawn out to a portion at which an FPC is latter attached so that a predetermined voltage can be applied thereto.

EL elements are thus formed on the substrate 1001. The lower side electrodes are transparent electrodes in this embodiment, and therefore light emitted by the EL layers 1004a to 1004c is irradiated to the lower surface (substrate 1001). However, the EL element structure can be reversed, and the lower side electrode can be made into a light shielding cathode. In this case, light emitted by the EL layers 1004a to 1004c is irradiated to the upper surface (side opposite the substrate 1001).

After forming the protective electrodes 1006, a barrier film 1307 is formed from an insulating material. The inorganic materials such as silicon nitride, silicon oxide, and carbon (specifically a DLC film) can be used, and the barrier film can be formed by CVD, sputtering, or evaporation. A silicon nitride film is formed by evaporation in this embodiment. Note that it is preferable that the film thickness of the barrier film 1007 be from 10 to 100 nm.

Next, an absorption film 1008 made from an absorption material is formed by evaporation. Note that a material having a small work coefficient and which easily oxidizes, such as barium, may be used as the absorption material here.

A passivation film 1009 composed of an insulating material is then formed on the absorption film 1008. Note that the EL element is weak with respect to oxygen, moisture, and the-like, and therefore it is preferable to perform film formation in succession from the EL layer to the passivation film.

A passive light emitting device having an attached FPC 1013 is thus complete.

Note that it is possible to implement the constitution of this embodiment by freely combining it with any of embodiments 1 and 2.

Embodiment 4

A method for preventing the incursion of contaminants from the outside such as oxygen and moisture after forming an enclosure structure of an EL element is explained in embodiment 4.

Figure 10A:
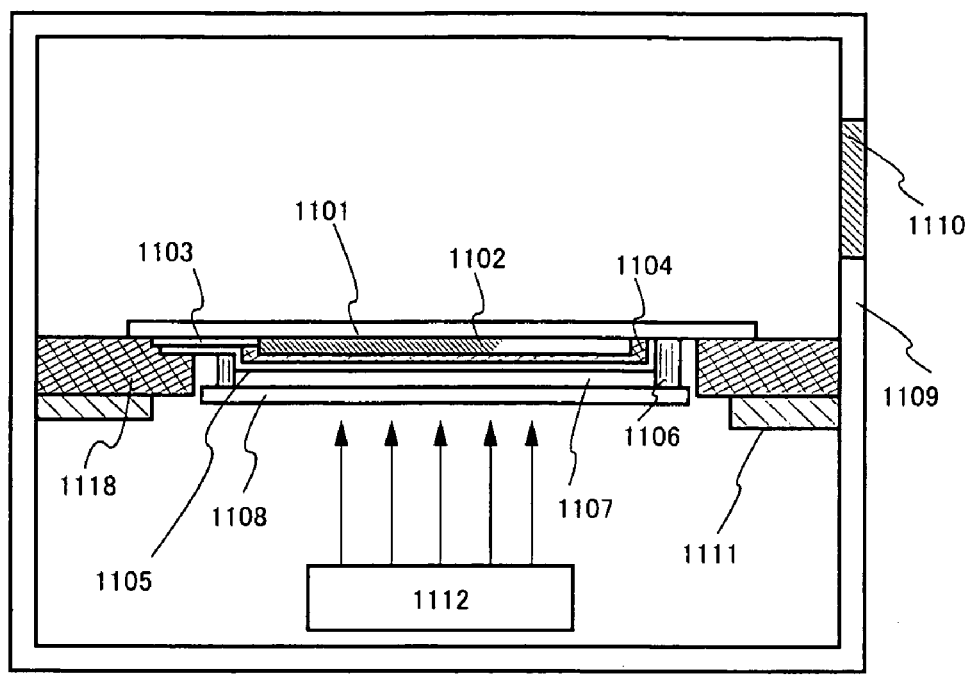
FIGS. 10A and 10B are diagrams for showing the enclosing of a light emitting device.

A cross sectional diagram of the inside of a film formation chamber 1109 for evaporating metallic films on EL panels having enclosure structures is shown simply in FIG. 10A. Note that the film formation chamber 1109 is in a state filled with an inert gas at atmospheric pressure.

Reference numeral 1101 denotes a substrate in FIG. 10A, and EL elements 1102 are formed on the substrate. An absorption film 1104 is formed so as to cover the EL elements 1102. A passivation film 1105 is formed on connection wirings 1103 from the EL elements 1102, and on the absorption film, and these are sealed by a sealing substrate 1108 and a sealant 1106. A region sealed the passivation film 1105 and the sealing substrate 1108 is a space 1107. The state formed up through this point is referred to as an EL panel within this specification.

Insertion and extraction of the EL panel is performed through a gate 1110 of the film formation chamber 1109. The side of the substrate on which the EL elements are formed is then faced toward the bottom, and the substrate is placed on a support stand 1111 through a mask 1118.

A low melting point metal for forming a metallic film is prepared as an evaporation source 1112 in the film formation chamber 1109. This is in consideration of damage of the sealant 1106 used in sealing due to heat during film formation. Specifically, it is preferable to use aluminum or magnesium.

Evaporation is then performed under atmospheric pressure. Note that a mask 1118 is formed when performing the film formation so as not to form the metallic film on the connection wirings 1103 covered by the passivation film 1105, or in other unnecessary areas. Further, the position of the evaporation source 1112 may be moved, and the position and the angle of the EL panel may be changed, in order to regulate the evaporation location.

Figure 10B:
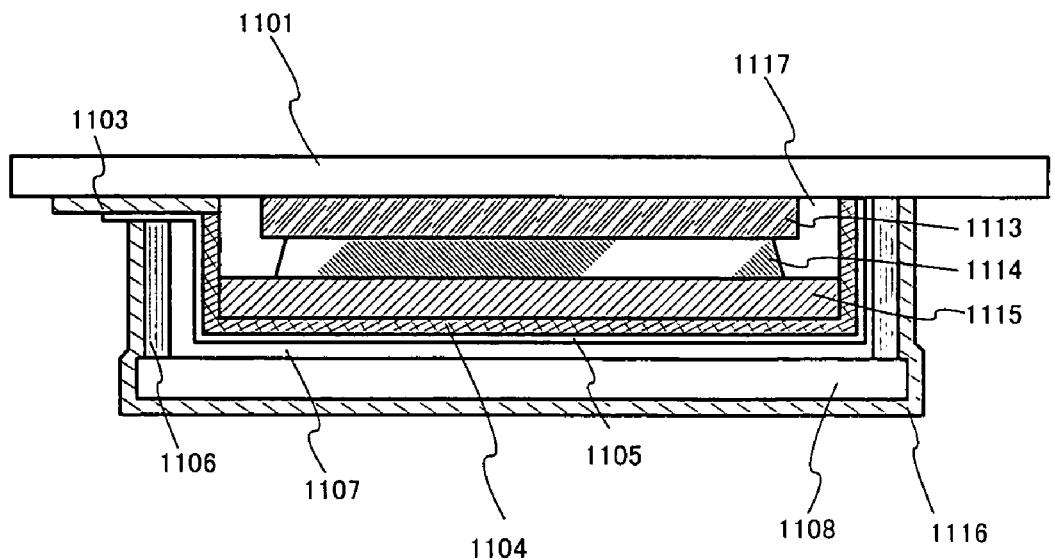

As shown in FIG. 10B, portions of the EL panel sealed by the sealant in this embodiment can be formed so as to be covered by the metallic film 1116. Further, reference numeral 1113, 1114, 1115, and 1117 denote an anode, an EL layer, a cathode, and an insulater.

Further, the metallic film can be formed under atmospheric pressure in this embodiment, and therefore problems associated with pressure changes inside the enclosure structure when the EL panel is removed to the atmosphere after film formation can be prevented.

Note that it is possible to implement the constitution of this embodiment by freely combining it with the constitution of any of embodiments 1 to 3.

Embodiment 5

An example of a film formation apparatus used when performing film formation, sealing processing and the like, from the formation of an EL layer to the formation of an enclosure structure in each of the above embodiments, is shown in this embodiment.

Figure 13:
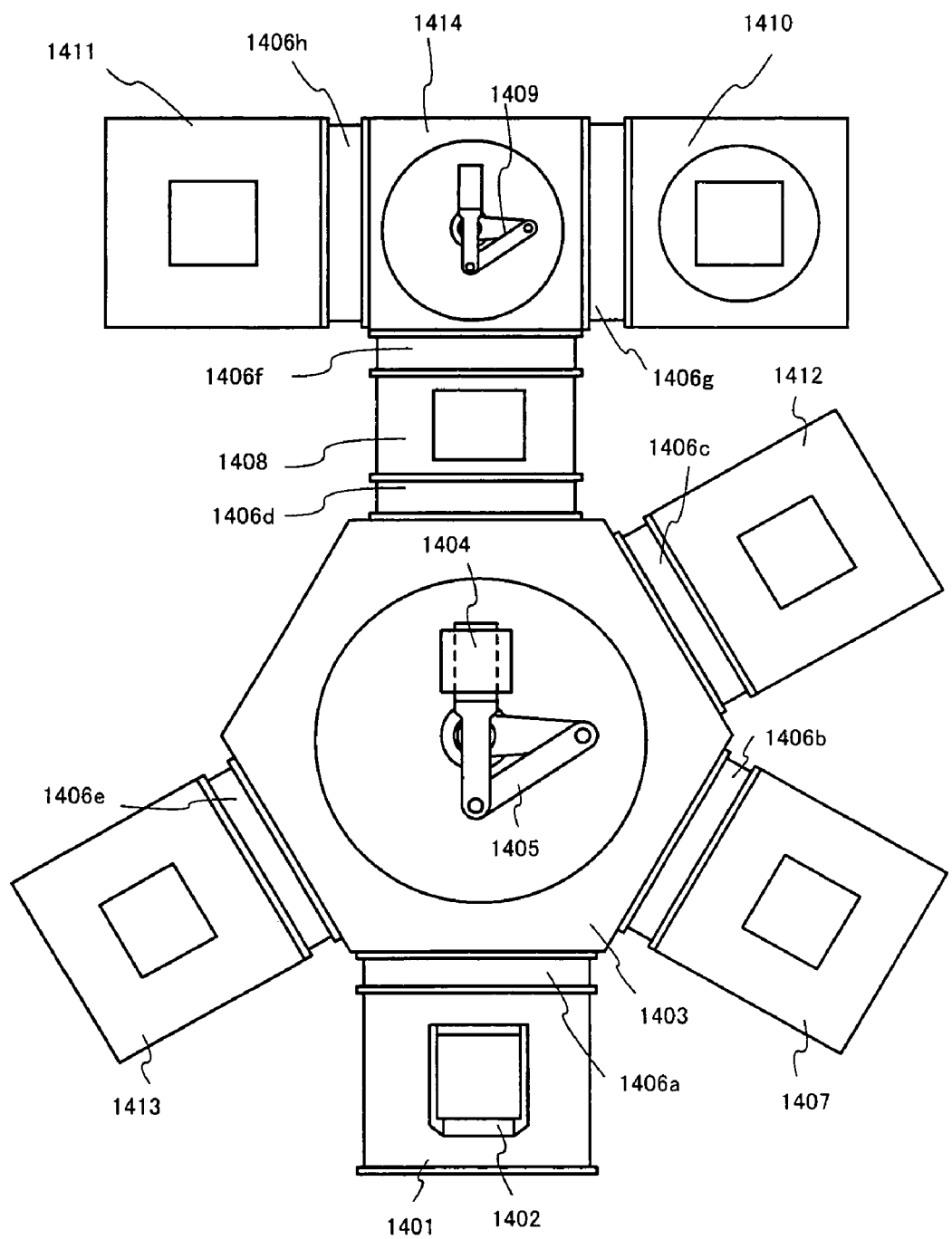
FIG. 13 is a diagram of a film formation apparatus used in forming a light emitting device of the present invention.

A thin film formation apparatus of the present invention is explained using FIG. 13. Reference numeral 1401 denotes a load chamber for performing entry and removal of a substrate, and the load chamber is also referred to as a load lock chamber. A carrier 1402 on which a substrate is set is located here. Note that the load chamber 1401 may also be segregated by substrate entry and substrate removal. A substrate in a state in which processing up through the formation of EL element anodes on the substrate is complete is set on the carrier in this embodiment.

Further, reference numeral 1403 denotes a conveyor chamber (A) containing a mechanism 1405 for conveying the substrate 1404 (also referred to as a conveyor mechanism (A)). One type of conveyor mechanism (A) 1405 is a robot arm for performing handling of a substrate.

A plurality of film formation chambers, processing chambers, and the like are connected to the conveyor chamber (A) 1403 through gates. Each of the film formation chambers, the conveyor chamber, and the processing chambers are completely cutoff from each other by the gates. Airtight sealed spaces are thus formed in each of these chambers. Note that the conveyor chamber (A) 1403 is under reduced pressure, and therefore an evacuation pump (not shown in the figure) is prepared in each of the processing chambers directly connected to the conveyor chamber (A) 1403.

It is possible to use a rotary oil pump, a mechanical booster pump, a turbo molecular pump, and a cryo pump as the evacuation pump, but a cryo pump effective in removing moisture is preferable.

A film formation chamber (A) denoted by reference numeral 1407 is explained first. The film formation chamber (A) 1407 is connected to the conveyor chamber (A) 1403 by a gate 1406*b*, and is a film formation chamber for performing film formation by evaporation. Note that a method utilizing resistivity evaporation by resistive heating (RE method), and a method utilizing electron beam (EB method) can be used as the evaporation method, and a case of performing evaporation by an RE method is explained in this embodiment.

Note that a hole injecting layer, a hole transporting layer, a light emitting layer, an electron transporting layer, and an electron injecting layer, all for forming an EL layer, are formed in the film formation chamber (A) 1407.

EL materials used in film formation are prepared in advance in a sample boat within the film formation chamber (A), and evaporation occurs by heat developing by the application of a voltage to the test piece boat. Note that EL materials are extremely weak with respect to moisture, and therefore it is necessary always maintain the pressure of the film formation chamber (A) 1407 in a vacuum state during an EL layer formation. Other than during the insertion and extraction of substrates to/from the film formation chamber (A) 1407, the film formation chamber (A) 1407 may be controlled so that it is normally completely cutoff from the conveyor chamber (A) 1405 by means of the gate 1406*b*, and there is a vacuum state within the film formation chamber. Note that the film formation pressure at this time must be set from $1\times10^{-6}$ to $1\times10^{-5}$ Torr.

Further, a window may also be attached to the side surfaces of the film formation chamber (A) 1407 as means of observing EL material film formation from outside of the apparatus. Thus it can be confirmed through the window whether film formation is conducted properly. A plurality of sample boats (not shown in the figure) in which EL materials are prepared are formed in the film formation chamber (A) 1407, so that a plurality of layers for forming the EL layer can be formed. Specifically, it is preferable to form between one and eight types of sample boats.

Films containing EL materials are formed by application of EL solutions containing EL materials onto a substrate in a film formation chamber (B) 1410 provided with a spin coater for cases of the EL layer formation using a spin coating method. Note that film formation is performed in the film formation chamber (B) 1410 when forming films of high molecular weight EL materials. However, depending upon the circumstances, film formation may also be performed in the film formation chamber (B) 1410 for cases in which a low molecular weight EL material is dissolved in a solvent.

Note that the film formation chamber (B) 1410 provided with the spin coater is connected to a conveyor chamber (B) 1414 through a gate 1406*g*. Note also that a substrate which has undergone film formation processing in the film formation chamber (B) 1410 is then conveyed to a firing chamber 1411 by a conveyor mechanism (B) 1409 through a gate 1406*h*, and firing is performed.

After firing processing is complete, the substrate is conveyed to a pressure regulation chamber 1408 connected to the conveyor chamber (B) 1414 through a gate 1406*f*. The gate 1406*f* is closed after the substrate is conveyed to the pressure regulation chamber 1408, and the inside of the pressure regulation chamber 1408 becomes a low pressure state.

When the inside of the pressure regulation chamber 1408 is under a state of constant low pressure or below, a gate 1406*d* is opened, and the substrate is extracted by the conveyor mechanism (A) 1405.

The substrate is conveyed to a film formation chamber (C) 1412 connected to the conveyor chamber (A) 1403 through a gate 1406*c* after the EL layers have been formed. The film formation chamber (C) is a film formation chamber for performing film formation by evaporation. Note that evaporation is performed by an RE method, similar to the film formation chamber (A) 1407 for forming the EL layers in this embodiment. Insulating films such as a barrier film, an absorption film, and a passivation film to be formed over the EL layer are then formed by evaporation in the film formation chamber (C) 1412.

A plurality of substrate boats (not shown in the figure) are also formed in the film formation chamber (C) 1412. Specifically, the insulating materials such as silicon nitride and silicon oxide, which are materials for forming a barrier film and a passivation film, and the film formation material such as barium for forming an absorption film, are prepared.

The substrate is conveyed to a sealing chamber 1413 connected to the conveyor chamber (A) 1403 through a gate

1406*e* when film formation up through the passivation film is complete. Note that final processing in order to tightly seal the EL element is performed in the sealing chamber 1413. Specifically, sealing of EL elements formed on the substrate by using a sealing substrate and a sealant is performed.

Materials such as glass, ceramics, and metals can be used as the sealing substrate, and thermosetting resins, ultraviolet setting resins, and the like can be used as the sealant.

Note that a function for performing heat treatment or ultraviolet light irradiation processing is provided to the sealing chamber 1413.

After sealing processing is performed in the sealing chamber 1413, the substrate is once again returned to the load chamber 1401 by the conveyor mechanism (A) 1405 through a gate 1406*a*.

Note that it is possible to implement the constitution of this embodiment by freely combining it with any of embodiments 1 to 4.

Embodiment 6

The light emitting device formed by implementing the present invention may be used as a display portion of various electrical appliances and the pixel portion may be used as an image display portion. As electrical appliances of this invention, there are such as a video camera, a digital camera, a goggle type display (head mounted display), a navigation system, an audio apparatus, a note type personal computer, a game apparatus, a portable apparatus (such as a mobile computer, a portable telephone, a portable game apparatus or an electronic book), and an image play back device equipped with a recording medium. Specific examples of the electronic appliances are shown in FIGS. 14A to 14F and 15A to 15F.

Figure 14A:
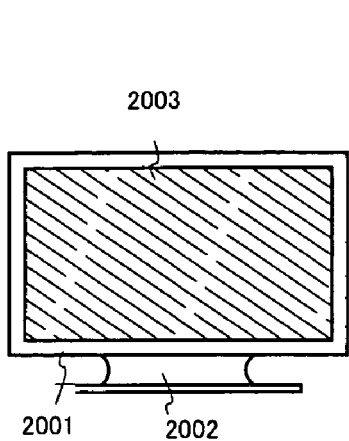
FIGS. 14A to 14F are diagrams showing specific examples of electronic equipment.

FIG. 14A shows an EL display and includes a casing 2001, a supporting base 2002 and a display portion 2003. The light emitting device of this invention may be used for the display portion 2003. When using the light emitting device having the EL element in the display portion 2003, since the EL element is a self light emitting type, a backlight is not necessary and the display portion may be made thin.

Figure 14B:
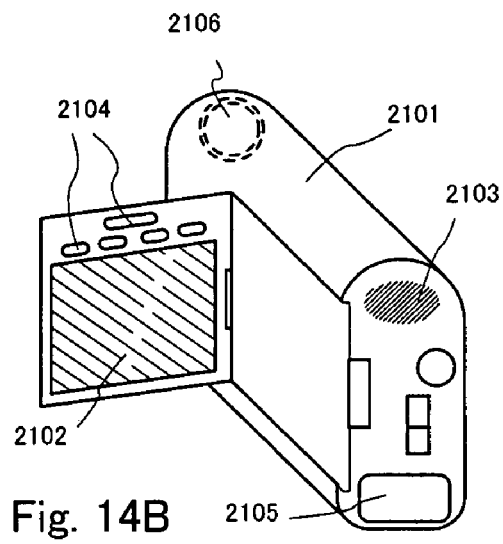

FIG. 14B shows a video camera, which contains a main body 2101, a display portion 2102, a sound input portion 2103, operation switches 2104, a battery 2105, and an image receiving portion 2106. The light emitting device of this invention can be applied to the display portion 2102.

Figure 14C:
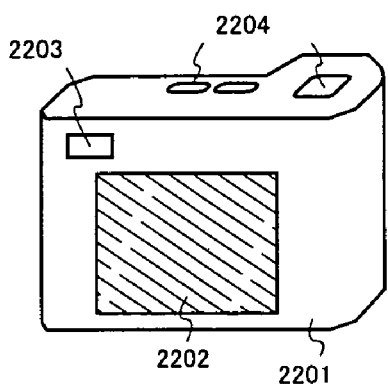

FIG. 14C shows a digital camera, which contains a main body 2201, a display portion 2202, an eye contact portion 2203, and operation switches 2204. The light emitting device of this invention can be applied to the display portion 2202.

Figure 14D:
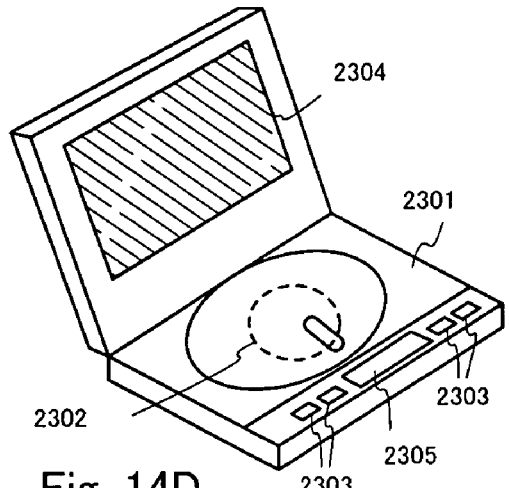

FIG. 14D shows an image playback device equipped with a recording medium (specifically, a DVD playback device), which contains a main body 2301, a recording medium (such as a CD, LD or DVD) 2302, operation switches 2303, a display portion (a) 2304, a display portion (b) 2305 and the like. The display portion (a) is mainly used for displaying image information. The display portion (b) 2305 is mainly used for displaying character information. The light emitting device of this invention can be applied to the display portion (a) and the display portion (b). Note that the image playback device equipped with the recording medium may include devices such as a CD playback device and the game apparatus.

Figure 14E:
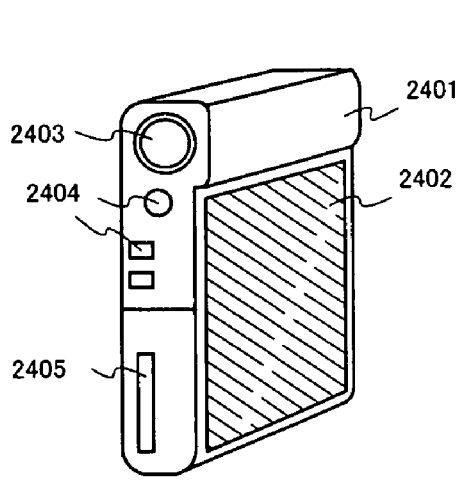

FIG. 14E shows a portable (mobile) computer, which contains a main body 2401, a display portion 2402, an image receiving portion 2403, operation switches 2404 and a memory slot 2405. The light emitting device of this invention can be applied to the display portion 2402. This portable computer may record information to a recording medium that has accumulated flash memory or involatile memory, and playback such information.

Figure 14F:
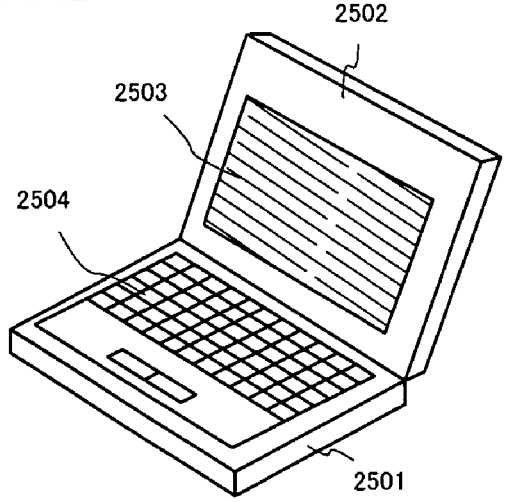

FIG. 14F shows a personal computer, which contains a main body 2501, a casing 2502, a display portion 2503, and a keyboard 2504. The light emitting device of this invention can be applied to the display portion 2503.

The above electronic appliances more often display information sent through electron communication circuits such as Internet or the CATV (cable television), and especially an opportunity of an image information display is increasing. When using the light emitting device having the EL element in the display portion, since the response speed of the EL element is extremely fast, it becomes possible to display an animation without delay.

Further, since the light emitting portion of the light emitting device consumes power, it is preferable to display information so that the light emitting portion is as small as possible. Therefore, when using the light emitting device in the portable information terminal, especially in the display portion where character information is mainly shown in a portable phone or an audio apparatus, it is preferable to drive so that the character information is formed of a light emitting portion with the non-light emitting portion as a background.

Figure 15A:
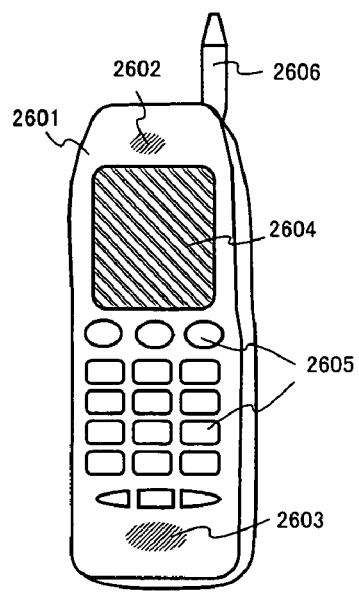
FIGS. 15A to 15F are diagrams showing specific examples of electronic equipment.

Here, FIG. 15A shows a portable telephone, which contains a main body 2601, a sound output portion 2602, a sound input portion 2603, a display portion 2604, an operation switch 2605 and an antenna 2606. The light emitting device of this invention can be applied to the display portion 2604. Note that, when using the light emitting device to the display portion 2604, the consumption power of the portable telephone may be suppressed by displaying the character in the light emitting portion with the background of the non-light emitting portion.

Figure 15B:
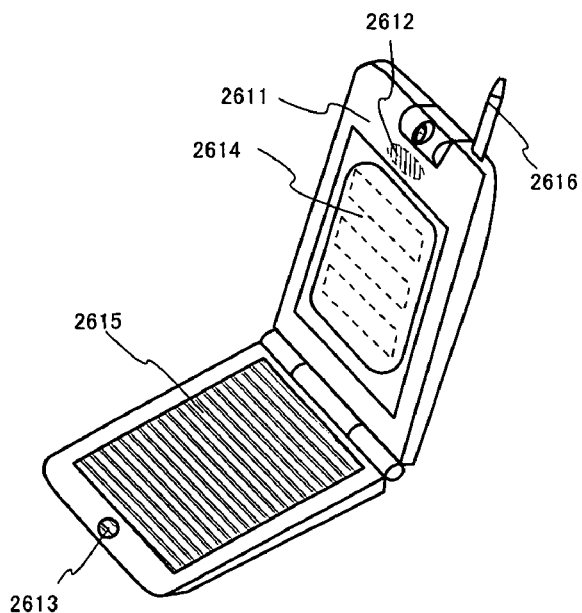
Figure 15C:
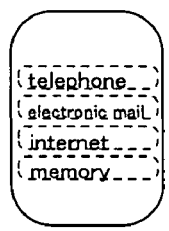
Figure 15D:
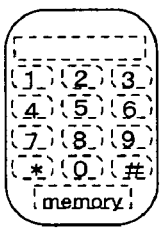
Figure 15E:
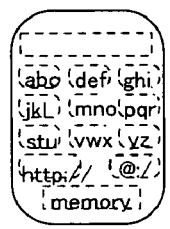

FIG. 15B shows also a portable telephone, but it is a folding twice type different from that of FIG. 15A, and contains a main body 2611, a sound output portion 2612, a sound input portion 2613, a display portion (a) 2614, a display portion (b) 2615 and an antenna 2616. The operation switch is not adhered to the portable telephone, but its function is provided to the portable telephone by displaying a character information shown in FIGS. 15C, 15D and 15E on either of the display portion (a) or (b). Further, another display portion displays mainly the image information. The light emitting device of this invention can be used as the display portion (a) 2614 or a display portion (b) 2615.

In the case of the portable telephone shown in FIGS. 15A and 15B, the light emitting devices used in the display portions are incorporated with a sensor by a CMOS circuit (a CMOS sensor), and may be used as an authentication system terminal for authenticating the user by reading the fingerprints or the hand of the user. Further, light emission may be performed by taking into consideration the brightness (illumination) of outside and making-information display at a contrast that is already set.

Further, in the case of FIG. 15A, the low power consumption may be attained by decreasing the brightness when using the operating switch 2605 and increasing the brightness when the use of the operation switch is finished. Further, the brightness of the display portion 2604 is increased when a call is received, and low power consumption is attained by decreasing the brightness during a telephone conversation. Further, when using the telephone continuously, by making it have a function so that display is turned off by time control unless it is reset, the low power consumption is realized. It should be noted that this control may be operated by hand.

Figure 15F:
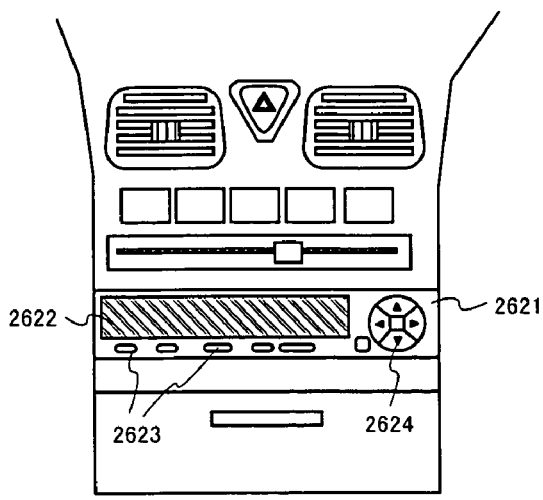
Figure 16:
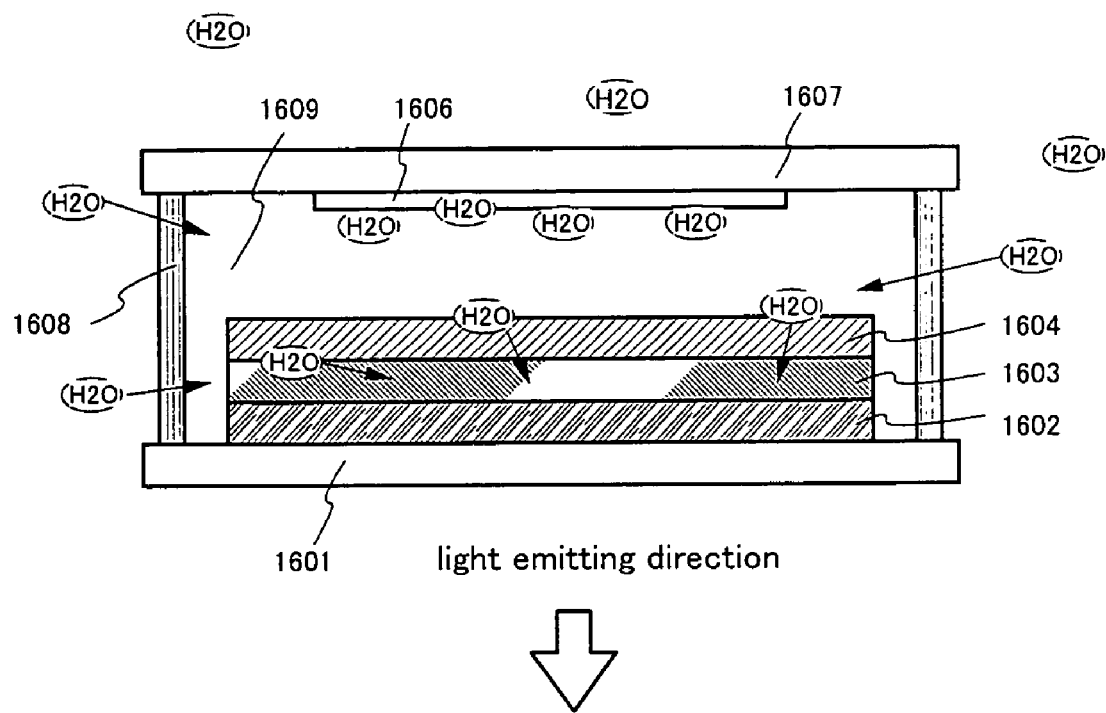
FIG. 16 is a diagram for explaining a conventional example.

Further, FIG. 15F shows an audio reproduction device, a car mounted audio in the concrete, which contains a main body 2621, a display portion 2622, and operation switches 2623 and 2624. The light emitting device of this invention can be applied to the display portion 2622. Further, in this embodiment, a car-mounted audio (car audio) is shown, but it may be used in a portable type or domestic type audio (audio component). Note that, when using a light emitting device in the display portion 2622, by displaying white characters in the light emitting portion with a black background of non-light emitting portion, power consumption may be suppressed. It is especially effective for the portable type audio.

In the case of the portable type electronic apparatuses shown in this embodiment, the sensor portion is provided to perceive the external light and the function to lower the brightness of the display portion is added to portable type electronic apparatuses when it is used in the dark area as a method to lower the power consumption.

As in the above, the applicable range of this invention is extremely wide, and may be used for various electrical equipments. Further, the electrical equipment of this embodiment may use the electronic device containing any of the structures of Embodiments 1 to 5.

By preparing an absorption metal as a film formed on EL elements on the inside of a sealed space, it becomes easier to made the interior of the space possess an absorption function, and further, an enclosure structure can be fabricated without the penetration of oxygen and moisture into the space because the absorption film can be formed in succession after formation the EL elements with the present invention.

What is claimed is:

1. A method of manufacturing a light emitting device comprising the steps of:
   providing a film formation apparatus;
   forming a first electrode over a substrate in the film formation apparatus;
   forming an EL layer over the first electrode in the film formation apparatus, wherein the EL layer comprises a hole injecting layer, a hole transporting layer, and a light emitting layer;
   forming a second electrode over the EL layer in the film formation apparatus;
   forming an absorption film over the EL layer in the film formation apparatus so as to cover the EL layer;
   forming a passivation film so as to cover the absorption film in the film formation apparatus;
   sealing a region which is covered with the passivation film by using a sealant and a sealing substrate in the film formation apparatus; and
   covering the sealant and the sealing substrate with a metallic film under atmospheric pressure,
   wherein the substrate is prevented from contacting an air outside of the film formation apparatus after the formation of the EL layer and until the formation of the absorption film is finished, and
   wherein the metallic film is formed by an evaporation method.

2. The method of manufacturing a light emitting device according to claim 1, wherein the absorption film is an inorganic hygroscopic film.

3. The method of manufacturing a light emitting device according to claim 2, wherein the inorganic hygroscopic film comprises alkaline-earth metal.

4. The method of manufacturing a light emitting device according to claim 2, wherein the inorganic hygroscopic film has 1 to 3 μm thickness.

5. The method of manufacturing a light emitting device according to claim 1, further comprising the step of, forming a barrier film so as to be interposed between the second electrode and the absorption film.

6. The method of manufacturing a light emitting device according to claim 5, wherein the protective electrode is formed from silver.

7. The method of manufacturing a light emitting device according to claim 1, further comprising the step of, forming a protective electrode so as to be interposed between the second electrode and the absorption film.

8. The method of manufacturing a light emitting device according to claim 1, wherein the metallic film is formed under inert condition.

9. A method of manufacturing a light emitting device comprising the steps of:
   forming a first electrode over a substrate;
   forming an EL layer over the first electrode, wherein the EL layer comprises a hole injecting layer, a hole transporting layer, and a light emitting layer;
   forming a second electrode over the EL layer;
   forming an absorption film over the second electrode so as to cover the EL layer;
   forming a passivation film so as to cover the absorption film;
   sealing a region which is covered with the passivation film by using a sealant and a sealing substrate; and
   covering the sealant and the sealing substrate with a metallic film under atmospheric pressure,
   wherein layers of the EL layer to the absorption film are formed in succession, and
   wherein the metallic film is formed by an evaporation method.

10. The method of manufacturing a light emitting device according to claim 9, further comprising the step of:
    forming a protective electrode so as to be interposed between the second electrode and the absorption film.

11. The method of manufacturing a light emitting device according to claim 10, wherein the protective electrode is formed from silver.

12. The method of manufacturing a light emitting device according to claim 9, further comprising the step of, forming a barrier film so as to be interposed between the second electrode and the absorption film.

13. The method of manufacturing a light emitting device according to claim 9, wherein the metallic film is formed under inert condition.

* * * * *

UNITED STATES PATENT AND TRADEMARK OFFICE
CERTIFICATE OF CORRECTION

PATENT NO. : 7,572,478 B2  Page 1 of 1
APPLICATION NO. : 11/192104
DATED : August 11, 2009
INVENTOR(S) : Ogura et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 997 days.

Signed and Sealed this

Seventh Day of September, 2010

David J. Kappos
*Director of the United States Patent and Trademark Office*